(12) United States Patent
Nishimura et al.

(10) Patent No.: US 8,841,776 B2
(45) Date of Patent: Sep. 23, 2014

(54) STACKED SEMICONDUCTOR CHIPS HAVING DOUBLE ADHESIVE INSULATING LAYER INTERPOSED THEREBETWEEN

(75) Inventors: Takao Nishimura, Kawasaki (JP); Yoshiaki Narisawa, Aizuwakamatsu (JP)

(73) Assignee: Fujitsu Semiconductor Limited, Yokohama (JP)

( * ) Notice: Subject to any disclaimer, the term of this patent is extended or adjusted under 35 U.S.C. 154(b) by 633 days.

(21) Appl. No.: 12/071,628

(22) Filed: Feb. 25, 2008

(65) Prior Publication Data
US 2008/0150120 A1    Jun. 26, 2008

Related U.S. Application Data

(63) Continuation of application No. PCT/JP2006/316489, filed on Aug. 23, 2006.

(30) Foreign Application Priority Data

Aug. 24, 2005 (JP) ................................ 2005-242780

(51) Int. Cl.
*H01L 25/065* (2006.01)

(52) U.S. Cl.
USPC ..... 257/777; 257/724; 257/783; 257/E25.013

(58) Field of Classification Search
USPC ......... 257/686, 723, 724, 777, 782–784, 786, 257/E25.013
See application file for complete search history.

(56) References Cited

U.S. PATENT DOCUMENTS

| 6,472,758 | B1 | 10/2002 | Glenn et al. |
| 6,657,290 | B2 | 12/2003 | Fukui et al. |
| 2002/0151103 | A1 | 10/2002 | Nakamura et al. |
| 2003/0042615 | A1* | 3/2003 | Jiang et al. ................. 257/777 |
| 2003/0189259 | A1 | 10/2003 | Kurita et al. |
| 2004/0224481 | A1 | 11/2004 | Tomimatsu |

FOREIGN PATENT DOCUMENTS

| JP | 8-88316 A | 4/1996 |
| JP | 11-97476 A | 4/1999 |
| JP | 2000-58743 A | 2/2000 |
| JP | 2002-222913 A | 8/2002 |
| JP | 2002-368190 A | 12/2002 |
| JP | 2003-303937 A | 10/2003 |
| JP | 2004-72009 A | 3/2004 |

(Continued)

OTHER PUBLICATIONS

International Search Report of PCT/JP2006/316489, date of mailing Oct. 31, 2006.

(Continued)

*Primary Examiner* — Marcos D. Pizarro
(74) *Attorney, Agent, or Firm* — Westerman, Hattori, Daniels & Adrian, LLP

(57) ABSTRACT

In a semiconductor chip, a first semiconductor chip 21 is provided on a chip-mounting component 11, and bonding wires 36 connected to electrode pads 21E of the first semiconductor chip 21 are fixed by being covered with a first insulating adhesive 31. A second semiconductor chip 22 is mounted by being stacked on the first semiconductor chip 21, with the first insulating adhesive 31 therebetween. This structure can prevent problems such as breaking and short-circuits of bonding wires of the chip disposed directly on a substrate when another chip is mounted by being stacked.

12 Claims, 21 Drawing Sheets

(56) References Cited

FOREIGN PATENT DOCUMENTS

| | | |
|---|---|---|
| JP | 2004-193363 A | 7/2004 |
| JP | 2004-253529 A | 9/2004 |
| JP | 2004-259749 A | 9/2004 |
| JP | 2005-340415 A | 12/2005 |

OTHER PUBLICATIONS

Chinese Office Action dated Apr. 3, 2009, issued in corresponding Chinese Patent Application No. 2006-800307901.

Korean Office Action dated Sep. 14, 2009, issued in Korean patent application No. 10-2008-7007076 (w/ partial translation).

Korean Office Action dated Apr. 5, 2010 issued in corresponding Korean Patent Application No. 10-2008-7007076.

Korean Office Action dated Aug. 12, 2010, issued in corresponding Korean Patent Application No. 10-2008-7007076.

Japanese Office Action dated Apr. 26, 2011, issued in corresponding Japanese Patent Application No. 2007-532149 (partial English language translation).

* cited by examiner

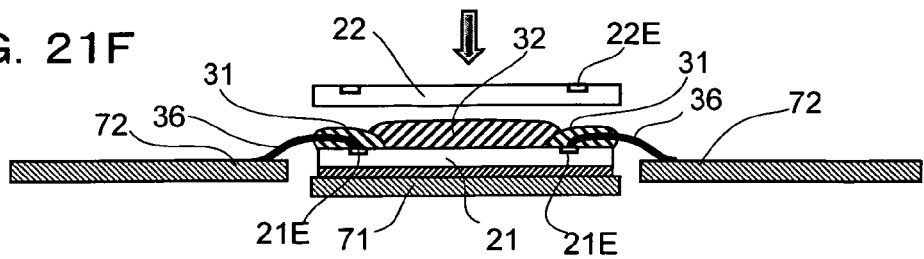
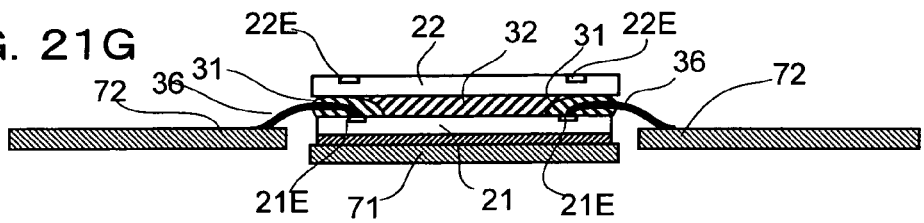
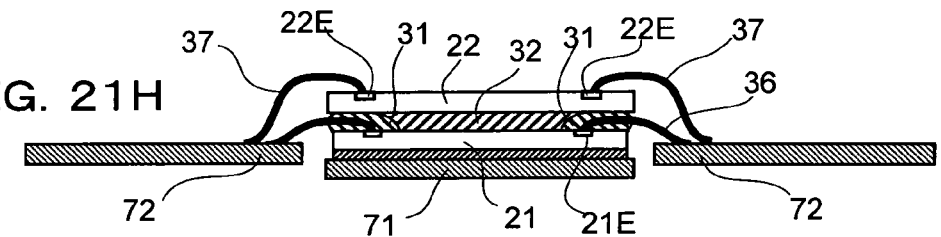
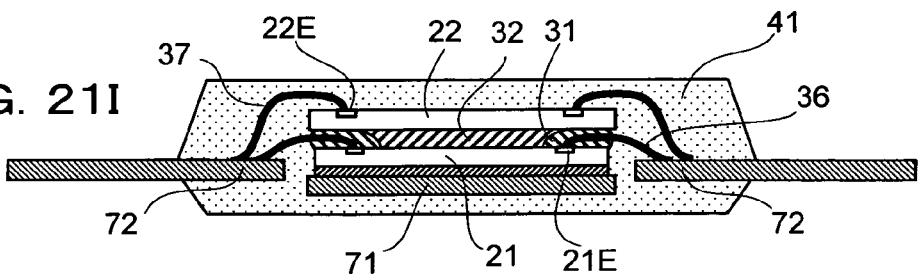
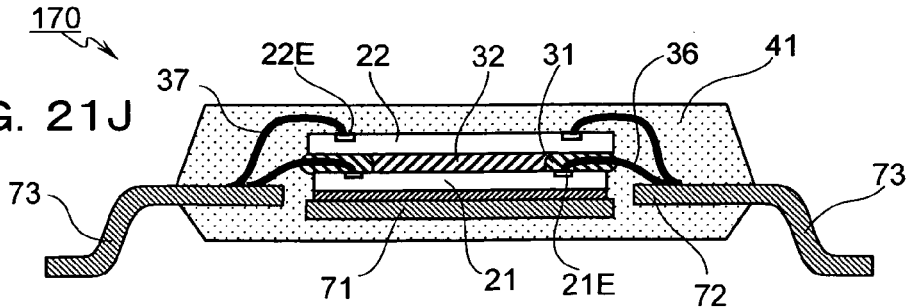

STACKED SEMICONDUCTOR CHIPS HAVING DOUBLE ADHESIVE INSULATING LAYER INTERPOSED THEREBETWEEN

BACKGROUND OF THE INVENTION

1. Field of the Invention

The present invention relates to a semiconductor device and a method of producing the same, and in particular, to a stacked-chip semiconductor device having a structure in which a second semiconductor chip is disposed on a first semiconductor chip and on bonding wires connected to electrode pads of the first semiconductor chip, and a method of producing the same.

2. Description of the Related Art

With the continuing increase in the number of functions of electronic devices and increase in the speed of electronic devices, a decrease in the size, a decrease in the thickness, an increase in the functionality, an increase in the performance, an increase in the density, and a reduction in the cost have been desired for semiconductor devices used in the electronic devices. In order to meet such requirements, three-dimensional semiconductor devices produced by stacking a plurality of semiconductor chips have been practically used. Such a semiconductor device is referred to as a "stacked package".

Semiconductor devices are produced by mounting a semiconductor chip on a semiconductor-chip-mounting component, such as a substrate or a lead frame, and then hermetically sealing the semiconductor chip.

A wire bonding method is widely used as a method of electrically connecting a semiconductor chip to a semiconductor-chip-mounting component. The wire bonding method is also often used for the stacked packages.

In a stacked package in which a substrate is used as a semiconductor-chip-mounting-and-supporting component, a first semiconductor chip to be disposed in a lower portion of the stacked package is fixed on the substrate using an insulating or a conductive adhesive, a second semiconductor chip to be disposed in an upper portion of the stacked package is disposed on the first semiconductor chip, and the second semiconductor chip is then bonded and fixed to the first semiconductor chip using an insulating adhesive. Subsequently, the first semiconductor chip is electrically connected to the substrate with first bonding wires, and the second semiconductor chip is electrically connected to the substrate with second bonding wires. The first and second semiconductor chips and the first and second wires are then sealed with a sealing resin.

An adhesive composed of an epoxy resin or the like is generally used as an insulating adhesive or a die-bonding material for bonding the second semiconductor chip onto the first semiconductor chip. The adhesive is used in the form of a liquid or a film.

Insulating adhesive films are widely used because they are advantageous in terms of workability and productivity. For example, an insulating adhesive film is applied in advance on a bottom surface of a semiconductor wafer, the surface not having electronic circuits thereon, and the insulating adhesive film is subjected to dicing together with the semiconductor wafer. As a result, a uniform amount of adhesive is applied on the bottom surface of each of the diced semiconductor chips.

In a stacked package in which a wire bonding connecting method is used as means for leading external connecting leads from a semiconductor chip, when a first semiconductor chip disposed in the lower portion of the stacked package is larger than a second semiconductor chip disposed in the upper portion of the stacked package and the electrode pads of the first semiconductor chip are located outside the second semiconductor chip, the electrode pads of the first semiconductor chip can be connected to electrode pads provided on a substrate by wire bonding.

However, in some combinations of semiconductor chips to be stacked, semiconductor chips having the same dimensions are arranged and stacked.

In such a stacking arrangement, electrode pads of a first semiconductor chip bonded on a substrate are connected to electrode pads provided on the substrate by a wire bonding method, a second semiconductor chip is bonded and fixed on the first semiconductor chip using an insulating adhesive, and then electrode pads of the second semiconductor chip are connected to electrode pads provided on the substrate by a wire bonding method.

According to such a fixing and connection structure, bonding wires connected to the electrode pads of the first semiconductor chip disposed in the lower portion of the stacked package can be in contact with, for example, the bottom surface of the second semiconductor chip disposed in the upper portion of the stacked package. Consequently, in order that the bonding wires connected to the electrode pads of the first semiconductor chip are not in contact with, for example, the bottom surface of the second semiconductor chip, it has been proposed that the bonding wires connected to the electrode pads of the first semiconductor chip be disposed in the insulating adhesive used for bonding the second semiconductor chip to the first semiconductor chip (see, for example, Patent Documents 1, 2, and 3).

In the technique disclosed in Patent Document 1, when a semiconductor chip to be disposed in the upper portion of a stacked package is bonded on a first semiconductor chip using an insulating adhesive, the thickness of the insulating adhesive is set so as to be higher than a loop top that is the top of bonding wires connected to electrode pads of the first semiconductor chip. In this case, a liquid insulating adhesive is applied to the entire surface of an area where the upper surface of the first semiconductor chip is to overlap with a second semiconductor chip. The second semiconductor chip is then placed on the insulating adhesive, and the insulating adhesive is cured by heating.

In this method, the distance between the first semiconductor chip and the second semiconductor chip is maintained by means of the insulating adhesive so as not to change the loop shape of each of the bonding wires. Therefore, the insulating adhesive requires a sufficiently large thickness, that is, an insulating adhesive with a sufficient thickness is necessary.

However, according to this method, it is difficult to control the thickness of the liquid insulating adhesive supplied to the first semiconductor chip. It is also difficult to control the degree of parallelization between the second semiconductor chip and the first semiconductor chip. If the second semiconductor chip is placed on the first semiconductor chip at an angle thereto and when electrode pads of the second semiconductor chip are connected to electrode pads provided on a substrate with bonding wires, a connection failure or the like may occur between the electrode pads of the second semiconductor chip and the bonding wires.

In the technique disclosed in Patent Document 2, an insulating resin layer made of a polyimide is provided between bonding wires connected to a first semiconductor chip and a second semiconductor chip disposed in the upper portion of a stacked package. More specifically, a die-bonding material film having a two-layer structure is applied on the bottom surface of the second semiconductor chip in advance. The die-bonding material includes a resin layer such as a polyimide insulating resin film which is used for providing a clearance and which is subjected to less plastic deformation in the range of 100° C. to 200° C., and another resin layer such as an epoxy resin layer which is used for providing adhesiveness and whose fluidity is increased by heating. When the second semiconductor chip is mounted on the first semiconductor chip, bonding wires connected to electrode pads of the first semiconductor chip are embedded in the resin layer with high fluidity and in contact with the other resin layer that is subjected to less plastic deformation, thereby preventing the bottom surface of the second semiconductor chip from being in contact with the bonding wires. In order that loops of the bonding wires are embedded in the resin layer with high fluidity, the second semiconductor chip is mounted by being stacked under heating.

This structure has the following problem. When the second semiconductor chip is mounted by being stacked on the first semiconductor chip, the loops of the bonding wires connected to the first semiconductor chip are pressed onto the die-bonding material having a two-layer structure. In the case where the fluidity of the resin layer with high fluidity is satisfactorily increased by heating, even when the loops of the bonding wires are pressed onto the resin layer, the change in the shapes of the loops of the bonding wires are negligible. However, when the loops of the bonding wires pass through the resin layer and reach the other layer that is used for providing a clearance and that is subjected to less plastic deformation, the shapes of the loops of the bonding wires are easily changed because of the hardness of the resin layer with less plastic deformation.

Furthermore, when the fluidity of the resin layer with high fluidity is not sufficient, the loops of the bonding wires are pressed onto the resin layer. Accordingly, when the loops are embedded in the resin layer under pressure, the shapes of the bonding wires are easily changed. The change in the shapes of the bonding wires causes short-circuits between adjacent bonding wires. In particular, in the case that the pitch of the electrode pads of the first semiconductor chip is small or electrode pads are provided at the central part of the semiconductor chip disposed in the lower portion of the stacked package, short-circuits between bonding wires easily occur. In addition, when a stress is applied to the bonding wires and the shapes of the bonding wires are changed, the stress becomes concentrated in portions where the bonding wires are connected to the lower semiconductor chip. Consequently, the bonding wires easily break at the connecting portions.

In the technique disclosed in Patent Document 3, a second semiconductor chip is bonded to a first semiconductor chip using a die-bonding material such that bonding wires connected to electrode pads of the first semiconductor chip are embedded in a part of the die-bonding material.

A method described in the above technique includes a step of decreasing the viscosity of the die-bonding material so that the bonding wires can be satisfactorily embedded in the die-bonding material when the second semiconductor chip is mounted by being stacked on the first semiconductor chip. In addition, the die-bonding material used for stacking and mounting the second semiconductor chip is an adhesive film composed of a plurality of adhesive layers having different viscosities when heated. The die-bonding material is disposed such that an adhesive layer that is in contact with the first semiconductor chip has a low viscosity. The die-bonding material is applied on the bottom surface of the second semiconductor chip in advance.

As in the means disclosed in Patent Document 2, this technique also has the following problem. When the second semiconductor chip is mounted by being stacked on the first semiconductor chip, the shapes of the bonding wires connected to electrode pads of the first semiconductor chip are changed. Accordingly, short-circuits between adjacent bonding wires easily occur, and the bonding wires easily break at portions where the bonding wires are connected to the first semiconductor chip.

Patent Document 1: Japanese Unexamined Patent Application Publication No. 8-88316
Patent Document 2: Japanese Unexamined Patent Application Publication No. 2002-222913
Patent Document 3: Japanese Unexamined Patent Application Publication No. 2004-72009

SUMMARY

According to one aspect an embodiment

A semiconductor chip according to one aspect of an embodiment includes a chip-mounting component; a first semiconductor chip provided on the chip-mounting component; bonding wires connected to electrode pads of the first semiconductor chip; a first insulating adhesive that selectively covers connecting portions where the electrode pads are connected to the bonding wires; and a second semiconductor chip provided on the first semiconductor chip, with the first insulating adhesive therebetween.

A method of producing a semiconductor device according to another aspect of an embodiment includes the steps of mounting a first semiconductor chip on a chip-mounting component; connecting bonding wires to electrode pads of the first semiconductor chip; selectively covering connecting portions where the electrode pads are connected to the bonding wires using a first insulating adhesive; and mounting a second semiconductor chip on the first semiconductor chip, with the first insulating adhesive therebetween.

BRIEF DESCRIPTION OF THE DRAWINGS

FIGS. 21F, 21G, 21H, 21I and 21J are process cross-sectional views (Part 2) showing the method of producing a stacked-chip semiconductor device according to the twelfth embodiment.

DESCRIPTION OF THE PREFERRED EMBODIMENTS

Stacked-chip semiconductor devices and methods of producing the semiconductor devices will now be described in detail using embodiments.

1. First Embodiment

Figure 1:
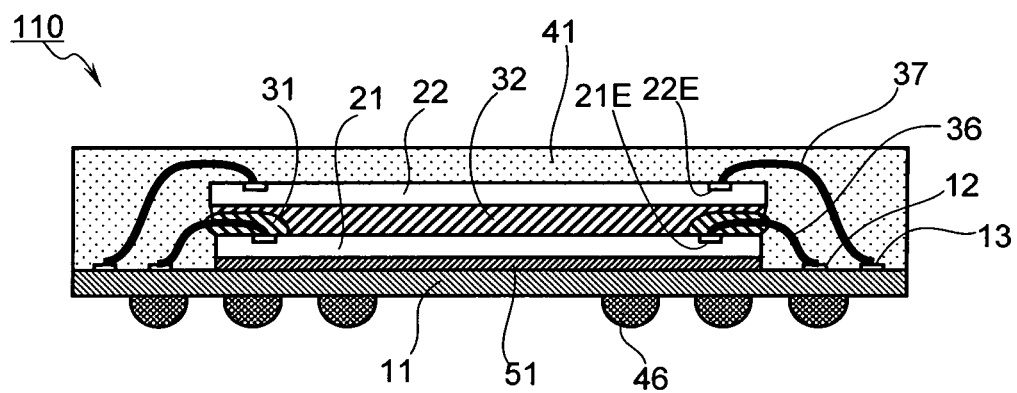
FIG. 1 is a cross-sectional view showing a stacked-chip semiconductor device according to a first embodiment.

A stacked-chip semiconductor device according to a first embodiment of will now be described with reference to FIG. 1.

A semiconductor device 110 of this embodiment includes a substrate 11 functioning as a chip-mounting component, a lower first semiconductor chip 21 that is mounted on one principal surface (top surface) of the substrate 11, and an upper second semiconductor chip 22 that is stacked on the first semiconductor chip 21, with an insulating adhesive therebetween.

The semiconductor device 110 further includes bonding wires 36 each connecting an electrode pad 21E of the first semiconductor chip 21 to an electrode pad 12 of the substrate 11, and bonding wires 37 each connecting an electrode pad 22E of the second semiconductor chip 22 to an electrode pad 13 of the substrate 11.

The semiconductor chips 21 and 22, the bonding wires 36 and 37, and the like are sealed with a sealing resin 41. A plurality of solder balls are provided as external connection terminals 46 on another principal surface (bottom surface) of the substrate 11.

The substrate 11 includes, as a base material, an organic insulating resin such as glass-epoxy, glass-bismaleimide triazine (BT), or a polyimide; or an inorganic material such as a ceramic or glass. According to need, a wiring layer made of copper (Cu) or the like is provided on one surface or both surfaces of the substrate 11 in the form of a single-layer structure or a multilayer interconnecting structure. The electrode pads 12 and 13 are provided on one of the principal surfaces, and pads (not shown) for disposing the external connection terminals 46 are provided on the other principal surface. The substrate 11 is also referred to as a wiring substrate, an interposer, or the like.

Each of the first semiconductor chip 21 and the second semiconductor chip 22 includes electronic circuits produced by forming active elements such as transistors, passive elements such as capacitors, and wiring layers connecting these elements on one principal surface of a substrate of a semiconductor such as silicon (Si) or gallium arsenide (GaAs) using a wafer process. The electrode pads 21E and 22E provided on the surface of the first semiconductor chip 21 and the second semiconductor chip 22, respectively, are made of a metal mainly composed of aluminum (Al) or copper (Cu).

The first semiconductor chip 21 is fixed on the substrate 11 using an adhesive 51 made of an insulating resin composed of an epoxy resin or a conductive resin composed of an epoxy resin containing metal particles such as silver (Ag) particles.

The bonding wires 36 and 37 are composed of gold (Au) wires, aluminum (Al) wires, or copper (Cu) wires and connected by a known wire bonding method.

The sealing resin 41 is made of an epoxy resin.

The external connection terminals 46 are not limited to protruding electrodes such as solder balls. Alternatively, flat-plate-shaped electrodes may be used.

The structure of the semiconductor device 110 of this embodiment has the following feature. The exposed portions of the electrode pads 21E of the first semiconductor chip 21 and a part of each of the bonding wires 36 connected to the electrode pads 21E, the part being located at least on the first semiconductor chip 21, are selectively covered with a first insulating adhesive 31.

The second semiconductor chip 22 is bonded on the first semiconductor chip 21 using a second insulating adhesive 32 disposed so as to cover the first semiconductor chip 21 and the first insulating adhesive 31.

Each of the first insulating adhesive 31 and the second insulating adhesive 32 is a thermosetting or thermoplastic resin adhesive, such as an epoxy resin, a polyimide resin, or an acrylic resin.

The first insulating adhesive 31 and the second insulating adhesive 32 may have physical properties different from each other.

According to this embodiment, since the electrode pads 21E and a part of each of the first bonding wires 36 are selectively covered with the first insulating adhesive 31, when the second semiconductor chip 22 is mounted on the first semiconductor chip 21 with the second insulating adhesive 32 therebetween, the second semiconductor chip 22 is not in contact with the first bonding wires 36.

Furthermore, this structure can prevent a phenomenon in which the shapes of the first bonding wires 36 are changed, thereby causing short-circuits between the first bonding wires 36, and a phenomenon in which the first bonding wires 36 break at portions where the first bonding wires 36 are connected to the electrode pads 21E.

Furthermore, since the first insulating adhesive 31 is provided on the first semiconductor chip 21 so as to cover the electrode pads 21E and a part of each of the first bonding wires 36, the height (thickness) of the first insulating adhesive 31 can be easily controlled during the above covering process.

More specifically, since the first insulating adhesive 31 having a controlled height is present, the second semiconductor chip 22 can be mounted by being stacked on the first semiconductor chip 21, while the distance between the first semiconductor chip 21 and the second semiconductor chip 22 is maintained at a predetermined value.

Accordingly, when the second semiconductor chip 22 is mounted and fixed on the first semiconductor chip 21, with the second insulating adhesive 32 therebetween, which is provided over the first insulating adhesive 31, the surface of the first semiconductor chip 21 can be made parallel to the surface of the second semiconductor chip 22 without causing the second semiconductor chip 22 to tilt.

Consequently, when the second bonding wires 37 are connected to the electrode pads 22E of the second semiconductor chip 22, the occurrence of connection failure and/or misalignment can be prevented.

Accordingly, the electrode pads 21E of the first semiconductor chip 21 can be disposed on the area overlapping with the second semiconductor chip 22. That is, the dimensions of the second semiconductor chip 22 are not limited by the positions of the electrode pads 21E of the first semiconductor chip 21. Thus, combinations of the dimensions of the first semiconductor chip 21 and the second semiconductor chip 22 can be chosen with a high degree of freedom.

2. Second Embodiment

Figure 2:
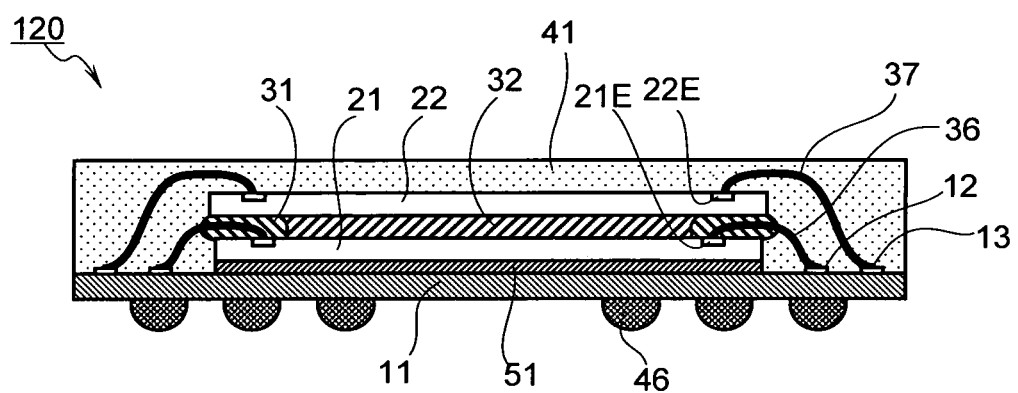
FIG. 2 is a cross-sectional view showing a stacked-chip semiconductor device according to a second embodiment.

A stacked-chip semiconductor device according to a second embodiment will now be described with reference to FIG. 2.

A semiconductor device 120 of this embodiment has a structure similar to that of the semiconductor device 110 of the first embodiment. However, in particular, this semiconductor device 120 is characterized by the structure of a portion of a first insulating adhesive 31 and a portion of a second insulating adhesive 32 that are used for bonding a lower first semiconductor chip 21 and an upper second semiconductor chip 22 mounted on the first semiconductor chip 21.

More specifically, the semiconductor device 120 of this embodiment has the following characteristic structure. The exposed portions of electrode pads 21E of the first semiconductor chip 21 and a part of each of bonding wires 36 connected to the electrode pads 21E, the part being located at least on the first semiconductor chip 21, are selectively covered with a first insulating adhesive 31, and the surface area of the first semiconductor chip 21 that is not covered with the first insulating adhesive 31 is covered with the second insulating adhesive 32.

The amount of second insulating adhesive 32 applied is set so that the height of the first insulating adhesive 31 is the same as the height of the second insulating adhesive 32, or the height of the second insulating adhesive 32 is slightly higher (thicker) than the height of the first insulating adhesive 31.

The second semiconductor chip 22 is fixed on the first semiconductor chip 21 using the first insulating adhesive 31 and the second insulating adhesive 32.

Each of the first insulating adhesive 31 and the second insulating adhesive 32 is a thermosetting or thermoplastic resin adhesive, such as an epoxy resin, a polyimide resin, or an acrylic resin.

The first insulating adhesive 31 and the second insulating adhesive 32 may have physical properties different from each other.

According to this embodiment, as in the first embodiment, since the electrode pads 21E and a part of each of the first bonding wires 36 are selectively covered with the first insulating adhesive 31, when the second semiconductor chip 22 is mounted on the first semiconductor chip 21 with the second insulating adhesive 32 therebetween, the second semiconductor chip 22 is not in contact with the first bonding wires 36.

Furthermore, this structure can prevent a phenomenon in which the shapes of the first bonding wires 36 are changed, thereby causing short-circuits between the first bonding wires 36, and a phenomenon in which the first bonding wires 36 break at portions where the first bonding wires 36 are connected to the electrode pads 21E.

Furthermore, as in the first embodiment, since the first insulating adhesive 31 is provided on the first semiconductor chip 21 so as to selectively cover the electrode pads 21E and a part of each of the first bonding wires 36, the height (thickness) of the first insulating adhesive 31 can be easily controlled during the above covering process. More specifically, since the first insulating adhesive 31 having a controlled height is present, the second semiconductor chip 22 can be mounted by being stacked on the first semiconductor chip 21, while the distance between the first semiconductor chip 21 and the second semiconductor chip 22 is maintained at a predetermined value.

Accordingly, when the second semiconductor chip 22 is mounted and fixed on the first semiconductor chip 21, with the second insulating adhesive 32 therebetween, which is provided so as to cover the first semiconductor chip 21, the surface of the first semiconductor chip 21 can be made parallel to the surface of the second semiconductor chip 22 without causing the second semiconductor chip 22 to tilt.

Furthermore, the first semiconductor chip 21 and the second semiconductor chip 22 are bonded using the first insulating adhesive 31 and the second insulating adhesive 32 having the same height (thickness) as that of the first insulating adhesive 31.

Accordingly, the mounting height of the second semiconductor chip 22 can be lower than that of the structure described in the first embodiment. Therefore, the total thickness of the semiconductor device 120 can be decreased.

In this structure, as in the first embodiment, the electrode pads 21E of the first semiconductor chip 21 can be disposed on the area overlapping with the second semiconductor chip 22. That is, the dimensions of the second semiconductor chip 22 are not limited by the positions of the electrode pads 21E of the first semiconductor chip 21. Thus, combinations of the dimensions of the first semiconductor chip 21 and the second semiconductor chip 22 can be chosen with a high degree of freedom.

3. Third Embodiment

Figure 3:
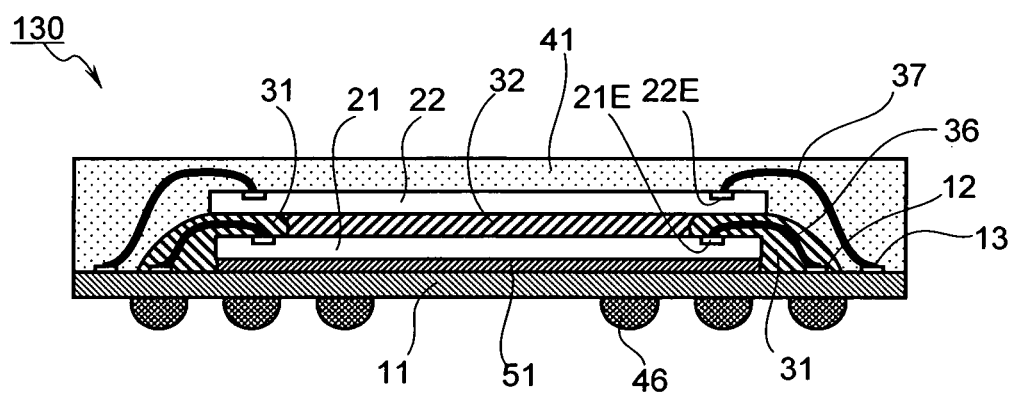
FIG. 3 is a cross-sectional view showing a stacked-chip semiconductor device according to a third embodiment.

A stacked-chip semiconductor device according to a third embodiment will now be described with reference to FIG. 3.

A semiconductor device 130 of this embodiment has a structure similar to that of the semiconductor device 120 of the second embodiment. However, in particular, this semiconductor device 130 is characterized by the structure of a portion of a first insulating adhesive 31 used for bonding a lower first semiconductor chip 21 and an upper second semiconductor chip 22 mounted on the first semiconductor chip 21.

More specifically, the semiconductor device 130 of this embodiment has the following characteristic structure. The exposed portions of electrode pads 21E of the first semiconductor chip 21, bonding wires 36 connected to the electrode pads 21E, and electrode pads 12 which are provided on a substrate 11 and to which another end of the bonding wires 36 is connected, are selectively covered with a first insulating adhesive 31, and the surface of the first semiconductor chip 21 that is not covered with the first insulating adhesive 31 is covered with a second insulating adhesive 32.

The amount of second insulating adhesive 32 applied is set so that the height of the first insulating adhesive 31 is the same as the height of the second insulating adhesive 32.

The second semiconductor chip 22 is bonded and fixed on the first semiconductor chip 21 using the first insulating adhesive 31 and the second insulating adhesive 32.

Each of the first insulating adhesive 31 and the second insulating adhesive 32 is a thermosetting or thermoplastic resin adhesive, such as an epoxy resin, a polyimide resin, or an acrylic resin.

The first insulating adhesive 31 and the second insulating adhesive 32 may have physical properties different from each other.

According to this embodiment, as in the first and second embodiments, the electrode pads 21E of the first semiconductor chip 21 and all the extending portions of the bonding wires 36 are selectively covered with the first insulating adhesive 31. Accordingly, when the second semiconductor chip 22 is mounted on the first semiconductor chip 21 with the second semiconductor chip 22 therebetween, the second semiconductor chip 22 is not in contact with the bonding wires 36.

Furthermore, by covering all of the extending portions of the bonding wires 36 with the first insulating adhesive 31, the bonding wires 36 are fixed so as to be integrated with the first semiconductor chip 21 and the substrate 11. Thus, changes in the shapes of the bonding wires 36 and/or breaking thereof can be prevented more effectively.

Furthermore, according to this structure, the side faces of the first semiconductor chip 21 in the directions in which the bonding wires 36 are led and extended are covered with the first insulating adhesive 31. As a result, fixing of the first semiconductor chip 21 on the substrate 11 is reinforced by the presence of the first insulating adhesive 31.

Accordingly, during the process of producing the semiconductor device 130, during the operation of the semiconductor device 130, or the like, even when a stress is concentrated between the first semiconductor chip 21 and the substrate 11, separation of the first semiconductor chip 21 from the substrate 11 can be prevented, and thus the semiconductor device 130 has high reliability.

Furthermore, as in the second embodiment, since the first insulating adhesive 31 is disposed on the first semiconductor chip 21 so as to cover the electrode pads 21E and the first bonding wires 36, the height (thickness) of the first insulating adhesive 31 can be controlled in the covering process.

More specifically, since the first insulating adhesive 31 having a controlled height is present, the second semiconductor chip 22 can be mounted by being stacked on the first semiconductor chip 21, while the distance between the first semiconductor chip 21 and the second semiconductor chip 22 is maintained at a predetermined value.

Accordingly, when the second semiconductor chip 22 is mounted and fixed on the first semiconductor chip 21, with the second insulating adhesive 32 therebetween, which is provided on the first semiconductor chip 21, the surface of the first semiconductor chip 21 can be made parallel to the surface of the second semiconductor chip 22 without causing the second semiconductor chip 22 to tilt.

Furthermore, the first semiconductor chip 21 and the second semiconductor chip 22 are fixed using the first insulating adhesive 31 and the second insulating adhesive 32 having the same height (thickness) as that of the first insulating adhesive 31.

Accordingly, the mounting height of the second semiconductor chip 22 can be lower than that of the structure described in the first embodiment. Therefore, the total thickness of the semiconductor device 130 can be decreased.

In this structure, as in the first embodiment and the second embodiment, the electrode pads 21E of the first semiconductor chip 21 can be disposed on the area overlapping with the second semiconductor chip 22.

That is, the dimensions of the second semiconductor chip 22 are not limited by the positions of the electrode pads 21E of the first semiconductor chip 21. Thus, combinations of the dimensions of the first semiconductor chip 21 and the second semiconductor chip 22 can be chosen with a high degree of freedom.

4. Fourth Embodiment

A stacked-chip semiconductor device according to a fourth embodiment will now be described with reference to FIG. 4.

A semiconductor device 140 of this embodiment has a structure similar to that of the semiconductor device 120 of the second embodiment. However, in particular, this semiconductor device 140 is characterized by the structure of a portion of a second insulating adhesive 32 used for bonding a lower first semiconductor chip 21 and an upper second semiconductor chip 22 mounted on the first semiconductor chip 21.

Figure 4:
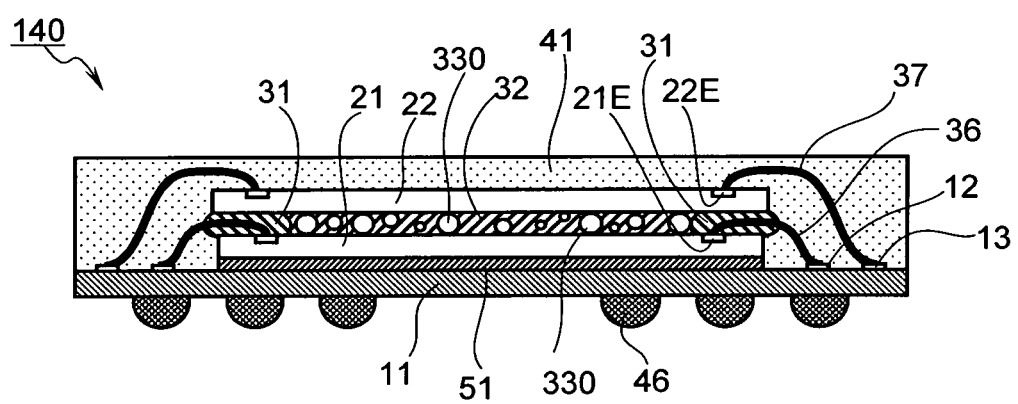
FIG. 4 is a cross-sectional view showing a stacked-chip semiconductor device according to a fourth embodiment.

More specifically, according to a feature of the structure of the semiconductor device 140 shown in FIG. 4, a second insulating adhesive 32 contains a filler 330 composed of particles of an insulating material.

The filler 330 is composed of particles of an insulating material such as an inorganic material, e.g., aluminum oxide (alumina), silicon dioxide (silica), magnesium oxide, silicon nitride, boron nitride, or aluminum nitride; or an organic material, e.g., an acrylic resin, a polyimide resin, or a rubber resin. Particles having a maximum dimension (diameter in the case of a spherical particle) larger than the diameter of bonding wires 36 are contained in the second insulating adhesive 32.

According to this embodiment in which the second insulating adhesive 32 contains the filler 330, in addition to the same advantages as those described in the second embodiment, since the filler 330 is dispersed in the second insulating adhesive 32, the distance between the first semiconductor chip 21 and the second semiconductor chip 22 can be specified by the filler 330 when the second semiconductor chip 22 is mounted by being stacked on the first semiconductor chip 21.

In addition, the first semiconductor chip 21 and the second semiconductor chip 22 can be disposed in parallel. Consequently, when second bonding wires 37 are connected to the electrode pads 22E of the second semiconductor chip 22, the occurrence of connection failure and/or misalignment can be prevented.

Furthermore, even when it is difficult to support the second semiconductor chip 22 so as to be parallel with the first semiconductor chip 21 only using a first insulating adhesive 31, for example, when first electrode pads 21E are disposed at the central part on the first semiconductor chip 21 or when the first electrode pads 21E are disposed on only one edge of the first semiconductor chip 21, the second semiconductor chip 22 can be supported in parallel by adding the filler 330 in the second insulating adhesive 32.

In the case where the thickness of the second semiconductor chip 22 is small, for example, 50 μm or less, when the second semiconductor chip 22 is stacked on the first semiconductor chip 21, the second semiconductor chip 22 easily warps. Therefore, the structure of this embodiment is effective in such a case.

The filler 330 may be composed of an elastic organic material. In such a case, when the second semiconductor chip 22 is mounted by being stacked on the first semiconductor chip 21, a stress of pressing a functional portion formed on the first semiconductor chip 21 caused by a load applied to the second semiconductor chip 22 can be decreased. Thus, the generation of malfunction caused by disconnection in the functional portion or the like can be suppressed.

Accordingly, the electrode pads 21E of the first semiconductor chip 21 can be disposed on the area overlapping with the second semiconductor chip 22. As a result, combinations of the dimensions of the first semiconductor chip 21 and the second semiconductor chip 22 can be chosen with a high degree of freedom, and a stacked-chip semiconductor device having high reliability and a smaller thickness can be produced.

(Modification of Fourth Embodiment)

A modification of the stacked-chip semiconductor device according to the fourth embodiment will now be described with reference to FIG. 5.

A semiconductor device 145 of this modification has the same basic structure as that of the semiconductor device 110 of the first embodiment. However, in particular, this semiconductor device 145 is characterized by the structure of a portion of a second insulating adhesive 32 used for bonding a lower first semiconductor chip 21 and an upper second semiconductor chip 22 mounted on the first semiconductor chip 21.

Figure 5:
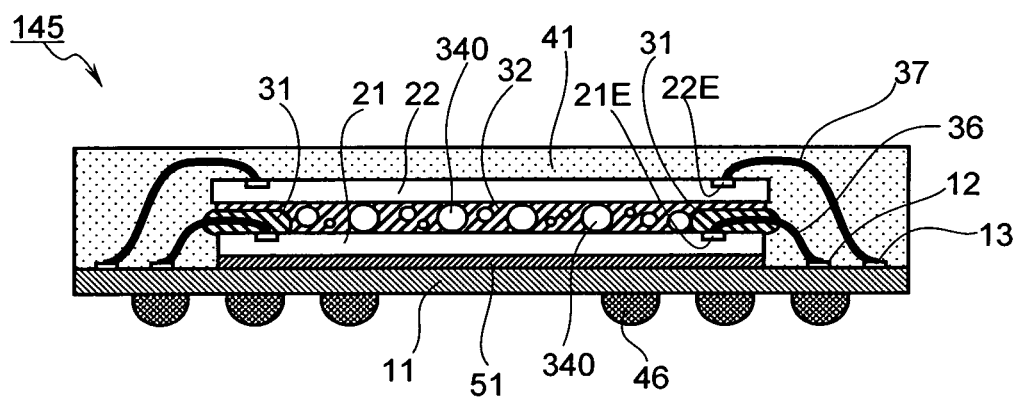
FIG. 5 is a cross-sectional view showing a modification of the stacked-chip semiconductor device according to the fourth.

More specifically, according to a feature of the structure of the semiconductor device 145 shown in FIG. 5, a second insulating adhesive 32 contains a filler 340 composed of particles of an insulating material.

Unlike the filler 330 in the fourth embodiment, the maximum dimension (diameter in the case of a spherical particle) of the filler 340 is larger than the diameter of bonding wires 36, and in addition, larger than the thickness of a first insulating adhesive 31. This filler 340 is contained in the second insulating adhesive 32.

As in the above-described embodiment, this structure can also provide advantages of the parallel support of the second semiconductor chip 22 and the like.

5. Fifth Embodiment

Figure 6:
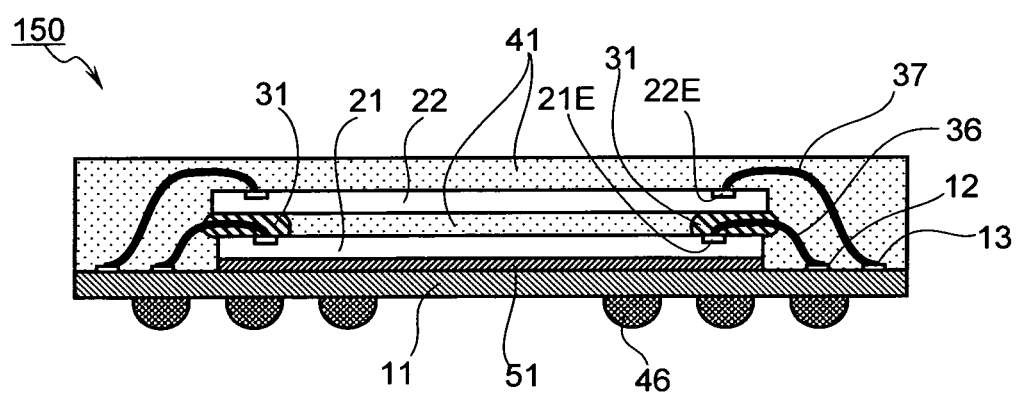
FIG. 6 is a cross-sectional view showing a stacked-chip semiconductor device according to a fifth embodiment.

A stacked-chip semiconductor device according to a fifth embodiment will now be described with reference to FIG. 6.

A semiconductor device 150 of this embodiment has a structure similar to that of the semiconductor device 120 of the second embodiment. However, in particular, this semiconductor device 150 is characterized by the structure of a portion where a lower first semiconductor chip 21 is bonded to an upper second semiconductor chip 22 mounted on the first semiconductor chip 21.

More specifically, the semiconductor device 150 has the following characteristic structure. The exposed portions of electrode pads 21E of the first semiconductor chip 21 and a part of each of bonding wires 36 connected to the electrode pads 21E are selectively covered with a first insulating adhesive 31. The surface area of the first semiconductor chip 21 that is not covered with the first insulating adhesive 31 is covered with a sealing resin 41.

The second semiconductor chip 22 is fixed on the first semiconductor chip 21 using the first insulating adhesive 31 and the sealing resin 41 disposed between the first semiconductor chip 21 and the second semiconductor chip 22.

According to this embodiment, in addition to the same advantages as those described in the second embodiment, all the exposed portions of the second semiconductor chip 22 including the top surface and the bottom surface thereof are covered with the sealing resin 41 except for the portions where the second semiconductor chip 22 is in contact with the first insulating adhesive 31. As a result, the difference between the stress generated on the top surface and the stress generated on the bottom surface of the second semiconductor chip 22 can be decreased.

This structure can prevent separation of the top surface of the second semiconductor chip 22 from the sealing resin 41 due to the difference between the stress generated on the top surface and the stress generated on the bottom surface of the semiconductor chip.

In addition, when the thickness of the second semiconductor chip 22 is as small as about 50 µm, cracking of the second semiconductor chip 22 due to the difference between the stress generated on the top surface and the stress generated on the bottom surface of the second semiconductor chip 22 can be prevented.

Furthermore, since the second insulating adhesive 32 used in the semiconductor device 120 described in the second embodiment is not used, the number of components constituting the semiconductor device 150 and the number of production steps can be decreased. Accordingly, the semiconductor device 150 can be produced at lower cost.

As in the second embodiment, since the first insulating adhesive 31 is disposed on the first semiconductor chip 21 so as to selectively cover the first electrode pads 21E and the first bonding wires 36, the height (thickness) of the first insulating adhesive 31 can be controlled in the covering process.

More specifically, since the first insulating adhesive 31 having a controlled height is present, the second semiconductor chip 22 can be mounted by being stacked on the first semiconductor chip 21, while the distance between the first semiconductor chip 21 and the second semiconductor chip 22 is maintained at a predetermined value.

Accordingly, when the second semiconductor chip 22 is mounted and fixed on the first semiconductor chip 21, with the sealing resin 41 provided between the first semiconductor chip 21 and the second semiconductor chip 22, the surface of the first semiconductor chip 21 can be made parallel to the surface of the second semiconductor chip 22 without causing the second semiconductor chip 22 to tilt.

Accordingly, the electrode pads 21E of the first semiconductor chip 21 can be disposed on the area overlapping with the second semiconductor chip 22, and thus combinations of the dimensions of the first semiconductor chip 21 and the second semiconductor chip 22 can be chosen with a high degree of freedom. Consequently, a stacked-chip semiconductor device having high reliability and a smaller thickness can be produced at lower cost.

6. Sixth Embodiment

Figure 7:
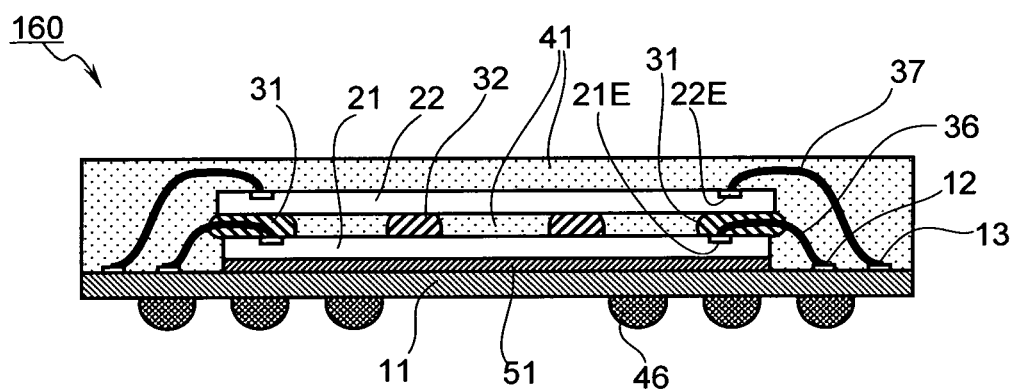
FIG. 7 is a cross-sectional view showing a stacked-chip semiconductor device according to a sixth embodiment.

A stacked-chip semiconductor device according to a sixth embodiment will now be described with reference to FIG. 7.

A semiconductor device 160 of this embodiment has the same basic structure as that of the semiconductor device 120 of the second embodiment. However, in particular, this semiconductor device 160 is characterized by the structure of a portion of a second insulating adhesive 32 used for bonding a lower first semiconductor chip 21 to an upper second semiconductor chip 22 mounted on the first semiconductor chip 21.

More specifically, the semiconductor device 160 has the following characteristic structure. The exposed portions of electrode pads 21E of the first semiconductor chip 21 and a part of each of bonding wires 36 connected to the electrode pads 21E are selectively covered with a first insulating adhesive 31. In addition, the second insulating adhesive 32 is locally disposed in the form of islands on the surface area of the first semiconductor chip 21 that is not covered with the first insulating adhesive 31.

The second semiconductor chip 22 is fixed on the first semiconductor chip 21 using the first insulating adhesive 31, the second insulating adhesive 32, and a sealing resin 41 filling the space between the first semiconductor chip 21 and the second semiconductor chip 22.

According to this embodiment, in addition to the same advantages as those described in the second embodiment, all the exposed portions of the second semiconductor chip 22 including the top surface and the bottom surface thereof are covered with the sealing resin 41 except for the portions where the second semiconductor chip 22 is in contact with the first insulating adhesive 31 and the second insulating adhesive 32. As a result, the difference between the stress generated on the top surface and the stress generated on the bottom surface of the second semiconductor chip 22 can be decreased.

In addition, this structure can prevent separation of the top surface of the second semiconductor chip 22 from the sealing resin 41 due to the difference between the stress generated on the top surface and the stress generated on the bottom surface of the semiconductor chip.

Furthermore, when the thickness of the second semiconductor chip 22 is as small as about 50 μm, cracking of the second semiconductor chip 22 due to the difference between the stress generated on the top surface and the stress generated on the bottom surface of the second semiconductor chip 22 can be prevented.

Furthermore, the space between the first semiconductor chip 21 and the second semiconductor chip 22 is fixed using the first insulating adhesive 31 and the second insulating adhesive 32. Accordingly, when the sealing resin 41 is supplied to fill the space between the first semiconductor chip 21 and the second semiconductor chip 22, separation of the second semiconductor chip 22 from the first semiconductor chip 21 caused by a stress generated during the filling of the sealing resin 41 can be prevented.

As in the fifth embodiment, since the first insulating adhesive 31 is provided on the first semiconductor chip 21 so as to selectively cover the electrode pads 21E and the first bonding wires 36, the height (thickness) of the first insulating adhesive 31 can be easily controlled during the above covering process.

More specifically, since the first insulating adhesive 31 having a controlled height is present, the second semiconductor chip 22 can be mounted by being stacked on the first semiconductor chip 21, while the distance between the first semiconductor chip 21 and the second semiconductor chip 22 is maintained at a predetermined value.

Accordingly, when the second semiconductor chip 22 is mounted and fixed on the first semiconductor chip 21 using the second insulating adhesive 32 applied on the first semiconductor chip 21 and the sealing resin 41, the surface of the first semiconductor chip 21 can be made parallel to the surface of the second semiconductor chip 22 without causing the second semiconductor chip 22 to tilt.

Therefore, the electrode pads 21E of the first semiconductor chip 21 can be disposed on the area overlapping with the second semiconductor chip 22, and thus combinations of the dimensions of the first semiconductor chip 21 and the second semiconductor chip 22 can be chosen with a high degree of freedom. Consequently, a stacked-chip semiconductor device having high reliability and a smaller thickness can be produced at lower cost.

7. Seventh Embodiment

Figure 8:
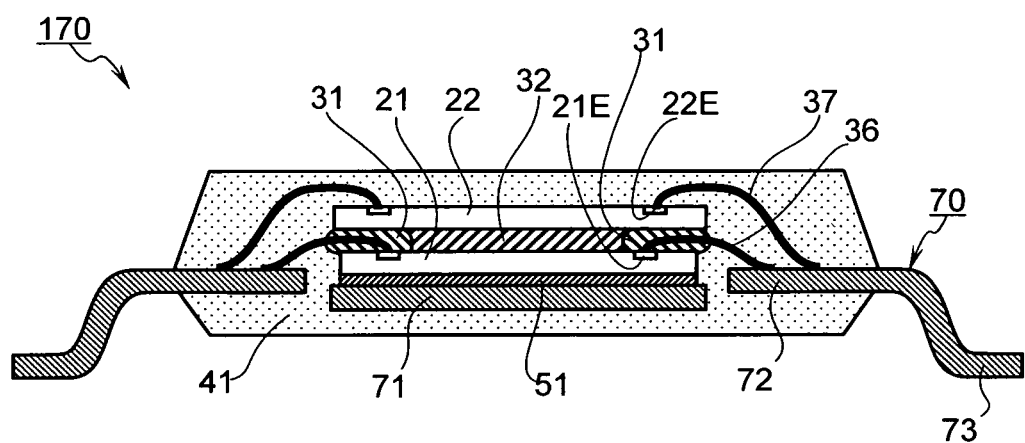
FIG. 8 is a cross-sectional view showing a stacked-chip semiconductor device according to a seventh embodiment.

A stacked-chip semiconductor device according to a seventh embodiment will now be described with reference to FIG. 8.

In a semiconductor device 170 of this embodiment, a lead frame 70 is used as a chip-mounting component.

More specifically, the semiconductor device 170 of this embodiment includes the lead frame 70 functioning as the chip-mounting component and a lead-guiding component, a lower first semiconductor chip 21 mounted on a die stage 71 of the lead frame 70, and an upper second semiconductor chip 22 stacked on the first semiconductor chip 21, with insulating adhesives therebetween.

The semiconductor device 170 also includes bonding wires 36 each connecting an electrode pad 21E of the first semiconductor chip 21 to an inner lead portion 72 of the lead frame 70, and bonding wires 37 each connecting an electrode pad 22E of the second semiconductor chip 22 to the inner lead portion 72 of the lead frame 70.

The semiconductor chips 21 and 22, the bonding wires 36 and 37, the lead frame 70, and the like are sealed with a sealing resin 41. Outer leads 73, each of which is another end of the inner lead, serve as external connection terminals.

The first semiconductor chip 21 is fixed on the die stage 71 using an adhesive 51 made of an insulating resin composed of an epoxy resin or a conductive resin composed of an epoxy resin containing metal particles such as silver (Ag) particles.

The bonding wires 36 and 37 are composed of gold (Au) wires, aluminum (Al) wires, or copper (Cu) wires and connected by a known wire bonding method.

Furthermore the sealing resin 41 is made of an epoxy resin.

The semiconductor device 170 having the above-described structure of this embodiment has the following characteristic structure. The exposed portions of the electrode pads 21E of the first semiconductor chip 21 and a part of each of the bonding wires 36 connected to the electrode pads 21E, the part being located at least on the first semiconductor chip 21, are selectively covered with a first insulating adhesive 31, and the surface of the first semiconductor chip 21 that is not covered with the first insulating adhesive 31 is covered with the second insulating adhesive 32.

The amount of second insulating adhesive 32 applied is set so that the height of the first insulating adhesive 31 is the same as the height of the second insulating adhesive 32.

The second semiconductor chip 22 is bonded and fixed on the first semiconductor chip 21 using the first insulating adhesive 31 and the second insulating adhesive 32.

Each of the first insulating adhesive 31 and the second insulating adhesive 32 is a thermosetting or thermoplastic resin adhesive, such as an epoxy resin, a polyimide resin, or an acrylic resin.

The first insulating adhesive 31 and the second insulating adhesive 32 may have physical properties different from each other.

According to this embodiment, as in the second embodiment, since the first electrode pads 21E and a part of each of the first bonding wires 36 are selectively covered with the first insulating adhesive 31, when the second semiconductor chip 22 is mounted on the first semiconductor chip 21 with the second insulating adhesive 32 therebetween, the second semiconductor chip 22 is not in contact with the first bonding wires 36.

Furthermore, this structure can prevent a phenomenon in which the shapes of the first bonding wires 36 are changed, thereby causing short-circuits between the first bonding wires 36, and a phenomenon in which the first bonding wires 36 break at portions where the first bonding wires 36 are connected to the electrode pads 21E.

Furthermore, as in the second embodiment, since the first insulating adhesive 31 is provided on the first semiconductor chip 21 so as to selectively cover the electrode pads 21E and a part of each of the first bonding wires 36, the height (thickness) of the first insulating adhesive 31 can be easily controlled during the above covering process.

Accordingly, when the second semiconductor chip 22 is mounted by being stacked on the first semiconductor chip 21, the distance between the first semiconductor chip 21 and the second semiconductor chip 22 can be maintained at a predetermined value because of the presence of the first insulating adhesive 31 having a controlled height.

That is, when the second semiconductor chip 22 is mounted and fixed on the first semiconductor chip 21 with the second insulating adhesive 32 therebetween, the stacking can be performed without causing the second semiconductor chip 22 to tilt.

Furthermore, as in the second embodiment, the first semiconductor chip 21 and the second semiconductor chip 22 are bonded using the first insulating adhesive 31 and the second insulating adhesive 32 having the same height (thickness) as that of the first insulating adhesive 31.

Accordingly, the mounting height of the second semiconductor chip 22 can be lower than that of the structure described in the first embodiment. Therefore, the total thickness of the semiconductor device 170 can be decreased.

Furthermore, the electrode pads 21E of the first semiconductor chip 21 can be disposed on the area overlapping with the second semiconductor chip 22, and thus combinations of the dimensions of the first semiconductor chip 21 and the second semiconductor chip 22 can be chosen with a high degree of freedom. Consequently, a stacked-chip semiconductor device having high reliability and a smaller thickness can be produced at lower cost.

8. Eighth Embodiment

Figure 9A:
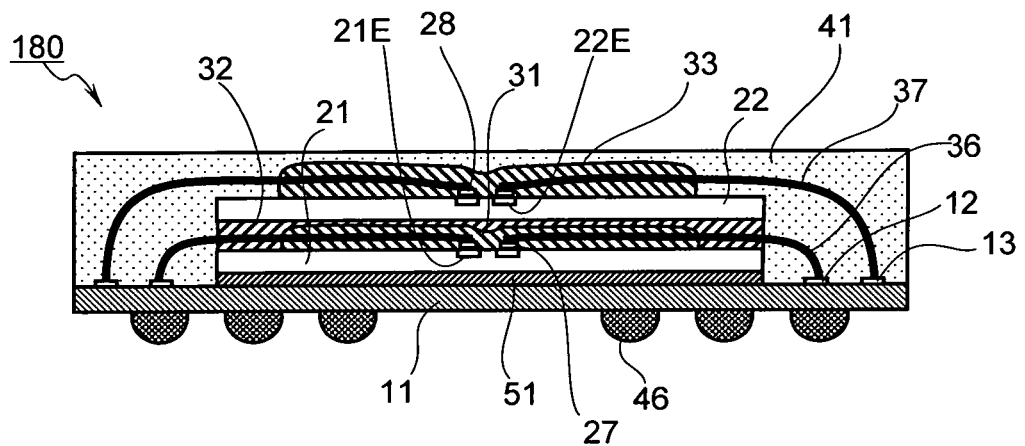
FIG. 9A is cross-sectional view showing a stacked-chip semiconductor device according to an eighth embodiment.
Figure 9B:
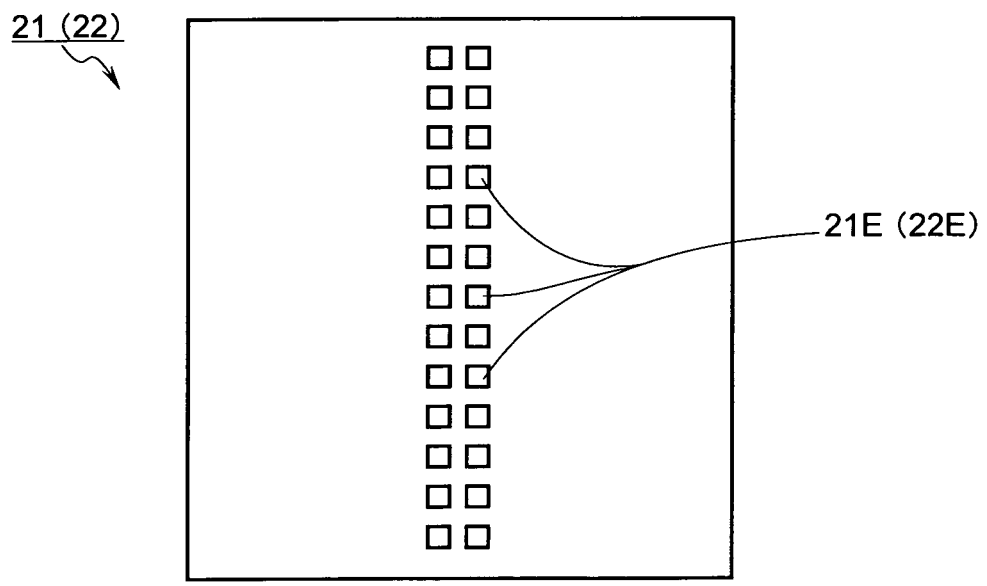
FIG. 9B is a plan view showing a stacked-chip semiconductor device according to an eighth.

A stacked-chip semiconductor device according to an eighth embodiment will now be described with reference to FIGS. 9A and 9B.

A semiconductor device 180 of this embodiment has the same basic structure as that of the semiconductor devices of the first to sixth embodiments. However, the semiconductor chip stacked as shown in FIG. 9A has a structure in which a plurality of electrode pads are arranged in lines near the central part of the surface of the semiconductor chip.

More specifically, the semiconductor device 180 of this embodiment has the following characteristic structure. As shown in FIG. 9(B), a plurality of electrode pads 21E (22E) of a first semiconductor chip 21 and a second semiconductor chip 22 are arranged in lines near the central part of the surfaces of the first semiconductor chip 21 and the second semiconductor chip 22, respectively.

Accordingly, bonding wires 36 (37) extending from the electrode pads 21E (22E) and connected to electrode pads on a substrate 11 have lengths longer than those in the structures of the embodiments described above.

In such long bonding wires, a change in the shape, breaking, or contact with other bonding wires easily occurs.

Therefore, the exposed portions of the electrode pads 21E of the first semiconductor chip 21 and a part of each of the bonding wires 36 connected to the electrode pads 21E, the part being located at least on the first semiconductor chip 21, are selectively covered with a first insulating adhesive 31.

The residual portions of the bonding wires 36 disposed on the first semiconductor chip 21 are covered with a second insulating adhesive 32. The second insulating adhesive 32 is provided so as to also cover the first insulating adhesive 31.

The second semiconductor chip 22 is fixed to the first semiconductor chip 21 using the second insulating adhesive 32 covering the first semiconductor chip 21 and the first insulating adhesive 31.

Furthermore, the exposed portions of the electrode pads 22E of the second semiconductor chip 22 and a part of each of the bonding wires 37 connected to the electrode pads 22E, the part being located at least on the second semiconductor chip 22, are selectively covered with a third insulating adhesive 33.

Each of the first insulating adhesive 31, the second insulating adhesive 32, and the third insulating adhesive 33 is a thermosetting or thermoplastic resin adhesive, such as an epoxy resin, a polyimide resin, or an acrylic resin.

The first insulating adhesive 31, the second insulating adhesive 32, and the third insulating adhesive 33 may have physical properties different from each other.

According to the semiconductor device 180 of this embodiment, even when semiconductor chips in which electrode pads are arranged in the central part are used, a stacked-chip semiconductor device can be easily produced.

Furthermore, a part of each of the second bonding wires 37 connected to the stacked second chip is covered and fixed on the second chip using the third insulating adhesive 33. Accordingly, when the semiconductor chips are sealed with a sealing resin 41, changes in the shapes of the second bonding wires 37 due to a flow of the sealing resin 41 can be prevented. Consequently, contact between adjacent bonding wires can be prevented.

The semiconductor device 180 of this embodiment also has the following characteristic structure. In this embodiment, bumps 27 and 28 may be provided on the electrode pads 21E and 22E, respectively, and bonding wires corresponding to the bumps 27 and 28 may be stitch-bonded.

The bumps 27 and 28 are made of a metal such as gold, copper, a gold alloy, or a copper alloy. In a stitch bonding, connection to the electrodes 12 and 13 on the substrate is performed as a first bonding, and connection to the bumps 27 and 28 is performed as a second bonding. Such a bonding method is referred to as a "reverse bonding method". As described above, when bumps are formed on electrode pads in advance and wires are then connected by the reverse bonding method, the height of the wire loops can be decreased, and thus the thickness of a semiconductor device can be decreased.

In addition, by connecting the electrode pads to the bonding wires via the bumps, the connection strength of the bonding wires can be increased.

Furthermore, since the bumps function as spacers, this structure can prevent a phenomenon in which a wire loop sags and is in contact with a circuit surface of a semiconductor chip and/or a corner of the semiconductor chip.

The reverse bonding method can be applied to all the above-described embodiments, as needed.

Figure 10A:
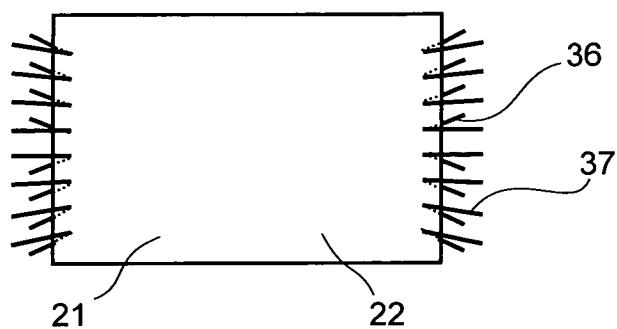
FIGS. 10A, 10B, and 10C are schematic views showing stacking arrangements of two semiconductor chips.
Figure 10B:
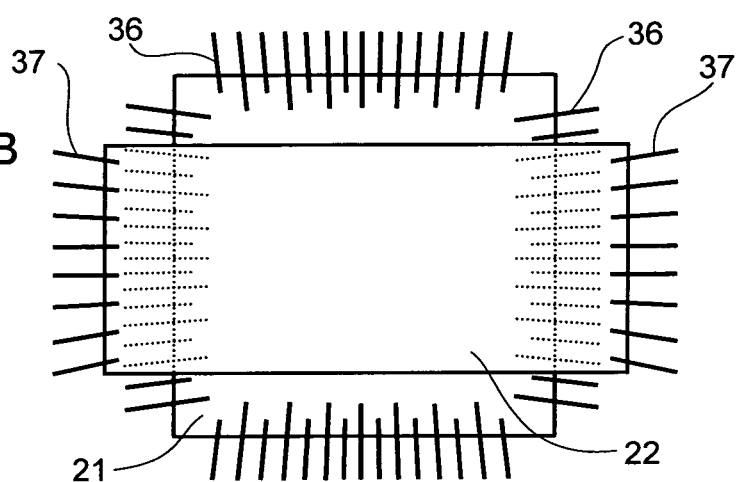
Figure 10C:
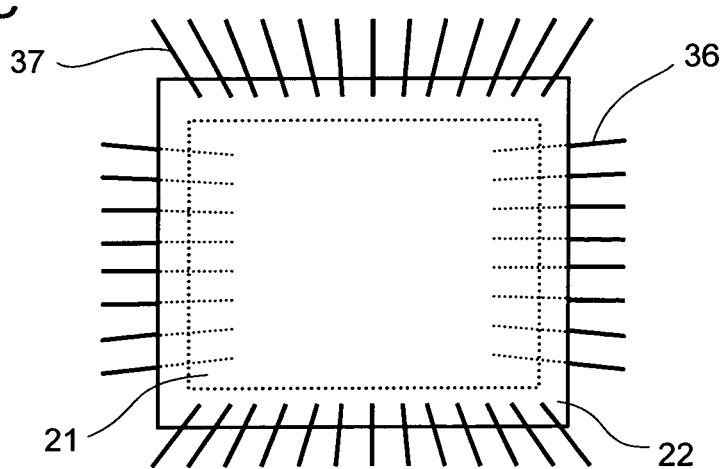

FIGS. 10A, 10B, and 10C show stacking arrangements of two semiconductor chips 21 and 22 in the stacked-chip semiconductor devices described in the first to eighth embodiments.

A first semiconductor chip 21 mounted on a chip-mounting component 11 or a die stage 71, and a second semiconductor chip 22 stacked on the first semiconductor chip 21 have various types of stacking arrangements in accordance with the shapes and the dimensions of the semiconductor chips.

FIG. 10A shows a lead arrangement of bonding wires in the case where a lower first semiconductor chip 21 and an upper second semiconductor chip 22 have the same dimensions.

In this structure, first bonding wires 36 are connected to the first semiconductor chip 21, and second bonding wires 37 are connected to the second semiconductor chip 22.

In this manner, when the upper second semiconductor chip 22 has the same dimensions as those of the lower first semiconductor chip 21, a stacked-package semiconductor device can be formed.

FIG. 10B shows a lead arrangement of bonding wires in the case where a first semiconductor chip 21 and a second semiconductor chip 22 to be stacked have different dimensions.

In this structure, the dimension of the first semiconductor chip 21 is larger than the dimension of the second semiconductor chip 22 in the vertical direction of the figure. On the other hand, the dimension of the second semiconductor chip 22 is larger than the dimension of the first semiconductor chip 21 in the horizontal direction of the figure. In this structure, first bonding wires 36 are connected to the first semiconductor chip 21, and second bonding wires 37 are connected to the second semiconductor chip 22.

In this case, electrode pads 21E of the first semiconductor chip 21 are arranged in a staggered pattern. Accordingly, the bonding wires 36 connected to the electrode pads 21E extend so as to correspond to the staggered pattern.

In this manner, when the dimensions of the lower first semiconductor chip 21 and the dimensions of the upper second semiconductor chip 22 are different from each other, a stacked-package semiconductor device can be formed.

When a semiconductor chip has such a staggered arrangement, the pitch of the first bonding wires 36 becomes small, and thus short-circuits easily occur when the shapes of the first bonding wires 36 are changed. However, as described in the first to eighth embodiments, occurrence of short-circuits between bonding wires can be prevented.

FIG. 10C shows another example of the case where a first semiconductor chip 21 and a second semiconductor chip 22 have different dimensions. The dimensions of the second semiconductor chip 22 disposed on the first semiconductor chip 21 are larger than those of the first semiconductor chip 21 in both the vertical direction and the horizontal direction.

First bonding wires 36 are connected to the first semiconductor chip 21, and second bonding wires 37 are connected to the second semiconductor chip 22.

The positions of electrode pads 21E of the first semiconductor chip 21 shown by the dotted lines are located inside the outer periphery of the first semiconductor chip 21. The lengths of the first bonding wires 36 are longer than the lengths of the second bonding wires 37.

In this manner, even in the case where the upper second semiconductor chip 22 is larger than the lower first semiconductor chip 21, a stacked-package semiconductor device can be formed.

In addition, in the case of a semiconductor chip in which first electrode pads are located inside the outer periphery of the semiconductor chip, bonding wires 36 connected to the first semiconductor chip 21 have a long length, and thus changes in the shapes of the bonding wires 36, short-circuits thereof, or the like easily occur. However, as described in the first to eighth embodiments, the occurrence of short-circuits can be prevented.

In all the stacked-chip semiconductor devices described in the first to eighth embodiments, during the production of the semiconductor devices, after first bonding wires are bonded to first electrode pads of a first semiconductor chip by wire bonding, the first electrode pads and at least a part of each of the first bonding wires are covered with a first insulating adhesive.

This covering of the first electrode pads and the first bonding wires with the first insulating adhesive prevents the first bonding wires connected to the first electrode pads from being in contact with the bottom surface of a second semiconductor chip when the second semiconductor chip is mounted by being stacked on the first semiconductor chip in the production of a semiconductor device. In addition, this covering structure prevents phenomena in which the shapes of the first bonding wires are changed and short-circuits occur between the first bonding wires, and the bonding wires break in the portions where the bonding wires are connected to the first electrode pads.

In addition, the first insulating adhesive is locally provided on the first semiconductor chip so as to cover the first electrode pads and a part of the first bonding wires. Therefore, when the first bonding wires are covered with the first insulating adhesive, the height of portions where the first insulating adhesive is provided can be easily controlled. Accordingly, when the second semiconductor chip is mounted by being stacked on the first semiconductor chip, the distance between the first semiconductor chip and the second semiconductor chip can be controlled to a predetermined value due to the presence of the portions where the first insulating adhesive 31 having a controlled height is provided. That is, the second semiconductor chip can be stacked on the first semiconductor chip without causing the second semiconductor chip to tilt. Consequently, when second bonding wires are connected to second electrode pads provided on the second semiconductor chip, the occurrence of connection failure and misalignment can be prevented.

The first insulating adhesive has an adhesive function of fixing the first semiconductor chip and the second semiconductor chip.

Furthermore, bonding pads may be bonded to the first bonding wires by ball bonding, and the first electrode pads may then be bonded to the first bonding wires by stitch bonding, thus connecting the bonding pads to the first electrode pads by wire bonding. When the wire bonding is performed using a reverse bonding method in this manner, the height of wire loops of the first bonding wire can be decreased.

In this case, the amount of first insulating adhesive supplied can be decreased, and the height of a portion where the insulating adhesive is provided can be decreased and controlled with high accuracy. Accordingly, when the second semiconductor chip is mounted on the first semiconductor chip, the levelness of the second semiconductor chip can be easily controlled, and a semiconductor device having a smaller thickness can be produced.

FIGS. 11A, 11B, 11C, and 11D and FIGS. 12A, 12B, and 12C show covering arrangements of an insulating adhesive provided on portions for connecting electrode pads to bonding wires and application arrangements of an insulating adhesive provided on a semiconductor chip in the stacked-chip semiconductor devices according to the first to eighth embodiments.

Figure 11A:
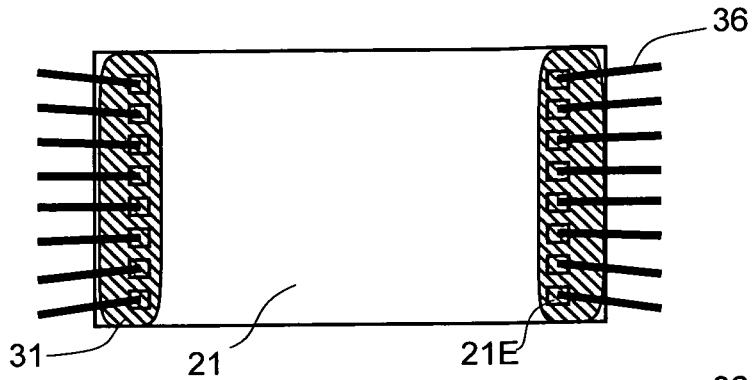
FIGS. 11A, 11B, 11C and 11D are plan views (Part 1) illustrating application arrangements of an insulating adhesive.

FIG. 11A shows a state in which, in a lower first semiconductor chip 21, first bonding wires 36 are connected to a plurality of first electrode pads 21E that are arranged in lines near the edges of two facing sides, and the electrode pads 21E and a part of each of the first bonding wires 36 are selectively covered with a first insulating adhesive 31.

The first insulating adhesive 31 integrally covers the pad lines of the first electrode pads 21E arranged in lines and wire lines of the first bonding wires 36 connected to the electrode pads 21E. This arrangement can be applied to the first, second, fourth, fifth, sixth, and seventh embodiments, and the advantages described in the embodiments can be achieved.

Figure 11B:
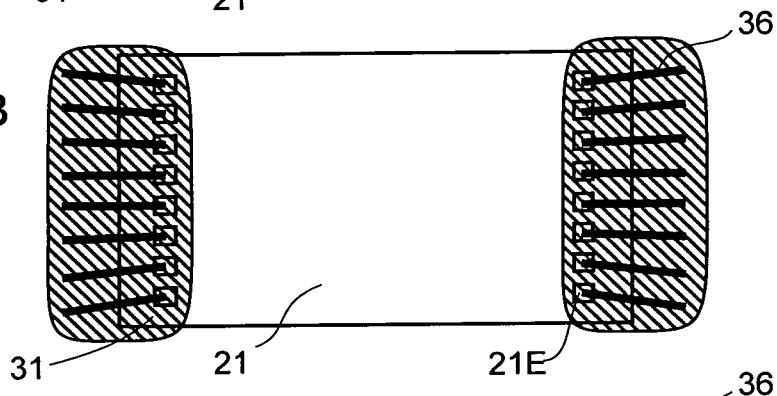

FIG. 11B shows a state in which, in a lower first semiconductor chip 21, first bonding wires 36 are connected to a plurality of electrode pads 21E that are arranged in lines near the edges of two facing sides, and the electrode pads 21E and the entirety of the extending portion of each of the first bonding wires 36 are selectively covered with a first insulating adhesive 31.

The first insulating adhesive 31 integrally covers the pad lines of the electrode pads 21E arranged in lines and wire lines of the first bonding wires 36. In addition, the first insulating adhesive 31 covers the first bonding wires 36 along the extending portions of the first bonding wires 36.

This arrangement corresponds to the arrangement of the semiconductor device 130 described in the third embodiment, and the advantages described in the third embodiment can be achieved.

Figure 11C:
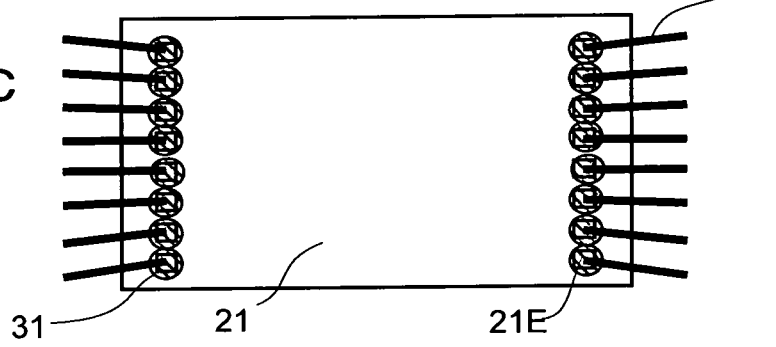

FIG. 11C shows a state in which, in a lower first semiconductor chip 21, first bonding wires 36 are connected to a plurality of electrode pads 21E that are arranged in lines near the edges of two facing sides, and the electrode pads 1 and a part of each of the first bonding wires 36 are selectively covered with a first insulating adhesive 31.

The first insulating adhesive 31 individually covers the electrode pads 21E arranged in lines and a part of each of the first bonding wires 36 connected to the electrode pads 21E. This arrangement can be applied to the first, second, fourth, fifth, sixth, and seventh embodiments instead of the arrangement shown in FIG. 11A, and the advantages described in the embodiments can also be achieved.

Furthermore, by individually supplying the first insulating adhesive 31 to each of the electrode pads 21E and covering the electrode pads 21E, the height of portions where the first insulating adhesive 31 is applied can be decreased, and the amount of first insulating adhesive 31 can be easily controlled with high accuracy. Therefore, when the second semiconductor chip 22 is mounted on the first semiconductor chip 21, it is easy to control the tilt of the surface of the second semiconductor chip 22.

Figure 11D:
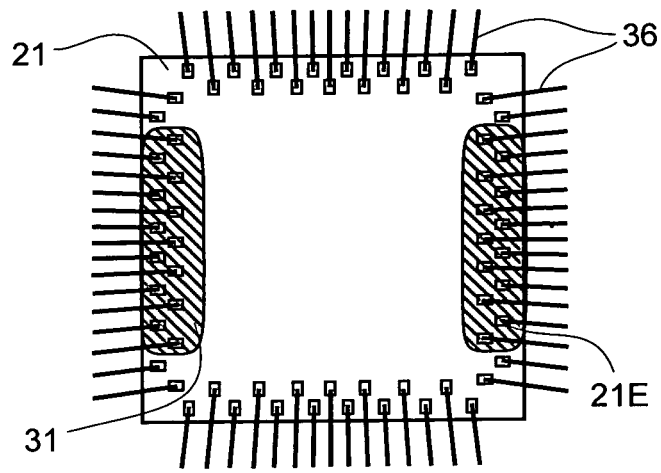

FIG. 11D shows a state in which, in a lower first semiconductor chip 21, first bonding wires 36 are connected to a plurality of electrode pads 21E that are arranged in lines near the edges of four sides, and, among these, some of the electrode pads 21E and the corresponding first bonding wires 36 that are disposed on two facing sides are selectively covered with a first insulating adhesive 31.

The first insulating adhesive 31 integrally covers the pad lines of the electrode pads 21E arranged in a staggered pattern and wire lines of the first bonding wires 36 connected to the electrode pads 21E. This arrangement can also be applied to the first, second, fourth, fifth, sixth, and seventh embodiments.

In the semiconductor device 160 described in the sixth embodiment, in the lower first semiconductor chip 21, the first insulating adhesive 31 covers the electrode pads 21E and the bonding wires 36; and in addition, a second insulating adhesive 32 is selectively applied on the first semiconductor chip 21.

Figure 12A:
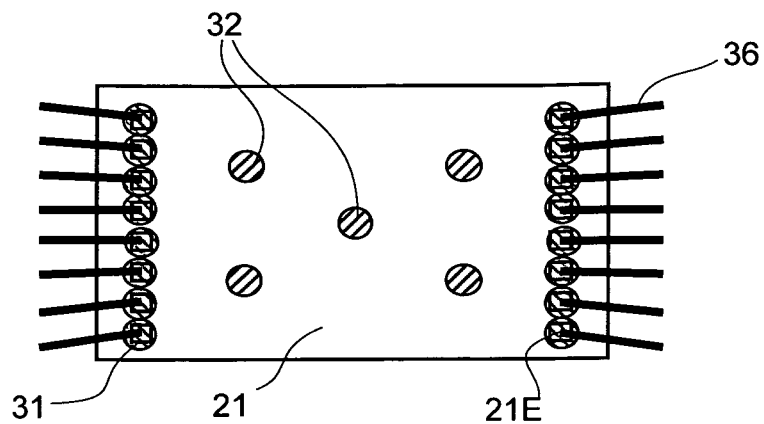
FIGS. 12A, 12B, and 12C are plan views (Part 2) illustrating application arrangements of an insulating adhesive.

Application arrangements of the second insulating adhesive 32 will be described below. FIG. 12A shows a state in which the second insulating adhesive 32 is selectively applied in the form of isolated islands on the surface of the first semiconductor chip 21 in the arrangement shown in FIG. 11C, that is, in a state in which the first bonding wires 36 are connected to a plurality of electrode pads 21E that are arranged in lines at the outer edges of two facing sides of the lower first semiconductor chip 21, and the electrode pads 21E and a part of each of the first bonding wires 36 are individually covered with the first insulating adhesive 31.

The second semiconductor chip 22 (not shown) is fixed on the first semiconductor chip 21 using the first insulating adhesive 31 and the second insulating adhesive 32.

As described in the sixth embodiment, the sealing resin 41 fills the space between the first semiconductor chip 21 and the second semiconductor chip 22 in which neither the first insulating adhesive 31 nor the second insulating adhesive 32 is present.

Figure 12B:
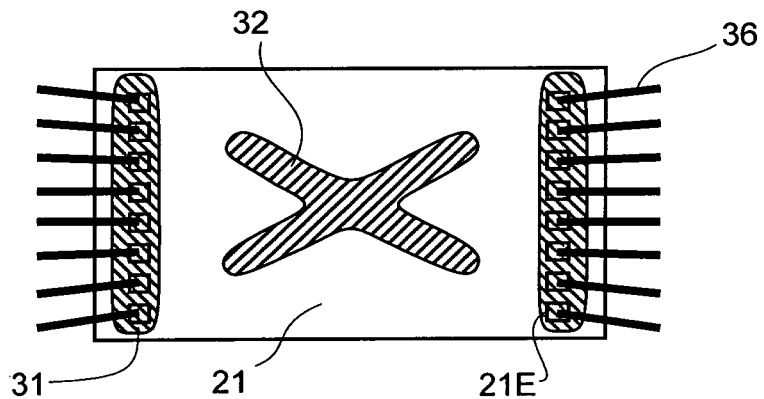

FIG. 12B shows a state in which the second insulating adhesive 32 is selectively applied in the form of bands on the surface of the first semiconductor chip 21 in the arrangement shown in FIG. 11A, that is, in a state in which first bonding wires 36 are connected to a plurality of electrode pads 21E that are arranged in lines at the outer edges of two facing sides of the lower first semiconductor chip 21, and the electrode pads 21E and a part of each of the first bonding wires 36 are covered with the first insulating adhesive 31.

Two bands of the second insulating adhesive 32 extend in the directions in which diagonal corners of the first semiconductor chip 21 connect to each other, i.e., extend along the diagonals, and cross to form the shape of the letter X.

The second semiconductor chip 22 (not shown) is fixed on the first semiconductor chip 21 using the first insulating adhesive 31 and the second insulating adhesive 32. According to this arrangement, the second semiconductor chip can be strongly fixed to the first semiconductor chip using the second insulating adhesive 32, compared with the arrangement shown in FIG. 12A.

In the above case, the application arrangement of the second insulating adhesive 32 is the shape of the letter X disposed along the diagonals of the first semiconductor chip 21. However, the application arrangement is not limited thereto. In this structure, the sealing resin 41 fills the space between the first semiconductor chip 21 and the second semiconductor chip 22 in which neither the first insulating adhesive 31 nor the second insulating adhesive 32 is present.

Figure 12C:
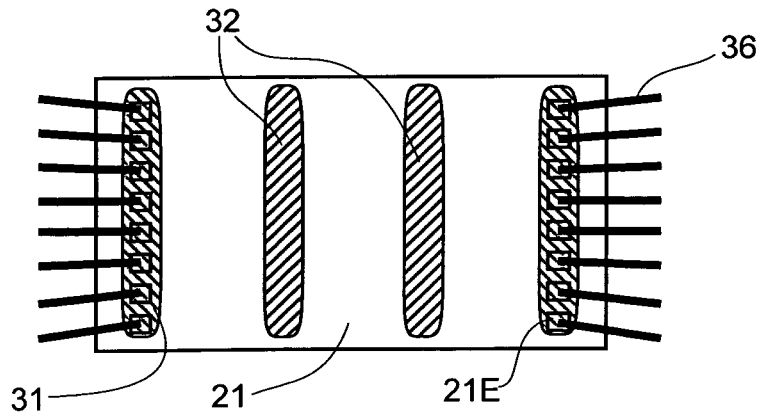

FIG. 12C shows a state in which the second insulating adhesive 32 is selectively applied in the form of parallel bands on the surface of the first semiconductor chip 21 in the arrangement shown in FIG. 11A, that is, in a state in which first bonding wires 36 are connected to a plurality of electrode pads 21E that are arranged in lines at the outer edges of two facing sides of the lower first semiconductor chip 21, and the electrode pads 21E and a part of each of the first bonding wires 36 are covered with a first insulating adhesive 31. The two bands of the second insulating adhesive 32 extend in the direction parallel to the electrode pad alignment of the first semiconductor chip 21.

The second semiconductor chip 22 (not shown) is fixed on the first semiconductor chip 21 using the first insulating adhesive 31 and the second insulating adhesive 32. According to this arrangement, the second semiconductor chip can be strongly fixed to the first semiconductor chip using the second insulating adhesive 32, compared with the arrangement shown in FIG. 12A.

In this structure, the sealing resin 41 fills the space between the first semiconductor chip 21 and the second semiconductor chip 22 in which neither the first insulating adhesive 31 nor the second insulating adhesive 32 is present. In this case, when the injection direction of the sealing resin 41 is parallel to the direction in which the first insulating adhesive 31 and the second insulating adhesive 32 are arranged (the vertical direction in the arrangement shown in the figure), the sealing resin 41 can be rapidly and reliably supplied to fill the space.

Embodiments of a method of producing a stacked-chip semiconductor device having the above-described characteristic structure will now be described in detail.

9. Ninth Embodiment

A first method of producing a stacked-chip semiconductor device of is shown in FIGS. 13A, 13B, 13C, 13D, and 13E, and FIGS. 14F, 14G, 14H, and 14I as a ninth embodiment.

Figure 13A:
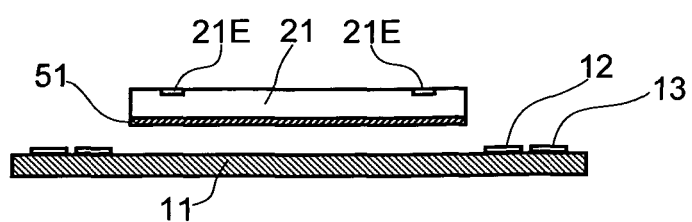
FIGS. 13A, 13B, 13C, 13D, and 13E are process cross-sectional views (Part 1) showing a method of producing a stacked-chip semiconductor device according to a ninth embodiment.

In this embodiment, first, a lower first semiconductor chip 21 is mounted on a substrate 11 used as a chip-mounting component (see FIG. 13A). The first semiconductor chip 21 includes electronic circuits and electrode pads 21E on one principal surface (top surface) thereof. The substrate 11 includes electrode pads 12 and 13 on a surface thereof on which the first semiconductor chip 21 is mounted.

A film adhesive 51 is fixed on the bottom surface of the first semiconductor chip 21 in advance. The first semiconductor chip 21 is bonded and fixed on the substrate 11 by pressing the first semiconductor chip 21 onto the substrate 11 while the substrate 11 is heated. In this fixing process, instead of heating the substrate 11, the first semiconductor chip 21 may be heated. Alternatively, both the substrate 11 and the first semiconductor chip 21 may be heated.

The heating temperature is in the range of about 50° C. to 100° C. at which the viscosity of the film adhesive 51 is decreased. Alternatively, the first semiconductor chip 21 is mounted on the substrate 11, and the adhesive 51, the substrate 11, and the first semiconductor chip 21 may then be heated in the range of about 120° C. to 240° C. to cure the adhesive 51. Alternatively, instead of using the film adhesive 51, a liquid adhesive may be supplied on the substrate 11 in advance.

Figure 13B:
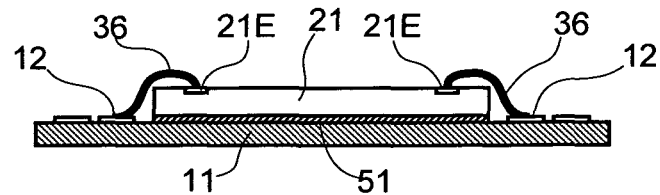

Subsequently, the electrode pads 21E of the first semiconductor chip 21 are connected (wire-bonded) to the electrode pads 12 of the substrate 11 using the first bonding wires 36 (see FIG. 13B).

In this wire bonding, either the normal bonding method in which a first bonding is performed on the electrode pads 21E of the first semiconductor chip 21 and a second bonding is then performed on the electrode pads 12 of the substrate 11, or a "reverse bonding method" in which a first bonding is performed on the electrode pads 12 of the substrate 11 and a second bonding is then performed on the electrode pads 21E of the first semiconductor chip 21 can be employed.

When the wire bonding is performed by the reverse bonding method, bumps may be formed on the electrode pads 21E in advance, and the second bonding may then be performed on the bumps. A ball bonding method or a selective plating method can be used as means for forming the bumps. When the wire bonding is performed by employing the reverse bonding method, the height of the loops of the bonding wire can be lower than that in the case where the normal wire bonding method is employed.

Figure 13C:
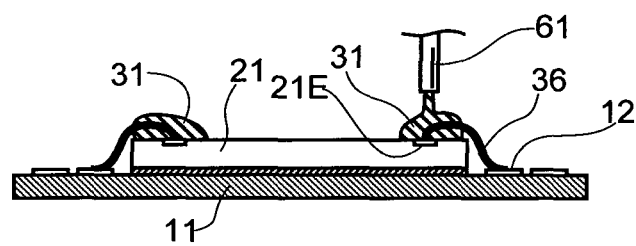

Subsequently, the areas near connecting portions including the exposed portions of the electrode pads 21E and the first bonding wires 36 connected to the electrode pads 21E are covered with a first insulating adhesive 31 (see FIG. 13C).

The first insulating adhesive 31 is a liquid resin adhesive and is supplied so as to form any one of the covering arrangements shown in FIGS. 11A, 11B, 11C, and 11D by being discharged from a nozzle 61 in a predetermined liquid amount. When the first insulating adhesive 31 is supplied, in order to prevent changes in the shapes of the first bonding wires 36, the first insulating adhesive 31 may be heated in the range of about 50° C. to 100° C. to increase the fluidity of the first insulating adhesive 31.

In supplying the first insulating adhesive 31, any one of a method of supplying the first insulating adhesive 31 while the substrate 11, the first semiconductor chip 21, and the first bonding wires 36 are heated; a method of supplying the first insulating adhesive 31 while the first insulating adhesive 31 is heated; and a method of supplying the first insulating adhesive 31 while the substrate 11, the first semiconductor chip 21, and the first bonding wires 36 are heated and the first insulating adhesive 31 is also heated can be selected. In the case where the first insulating adhesive 31 is supplied to a plurality of areas, the amount of first insulating adhesive 31 supplied is controlled such that the heights of the first insulating adhesive 31 in each of the areas are the same when the first insulating adhesive 31 is in a cured state or a semi-cured state.

Figure 13D:
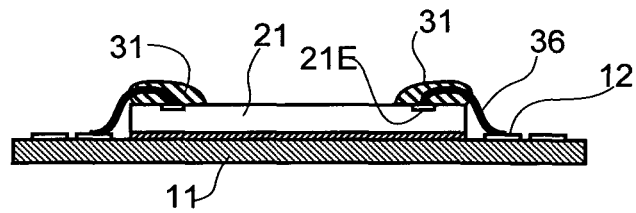

Subsequently, the first insulating adhesive 31 is in a cured state or a semi-cured state (B-stage state), and near areas including the electrode pads 21E and the portions where the electrode pads 21E are connected to the first bonding wires 36 are then fixed (see FIG. 13D). The process of curing or semi-curing the first insulating adhesive 31 is appropriately selected in accordance with the material of the first insulating adhesive 31. For example, when the first insulating adhesive 31 is a thermosetting resin, the first insulating adhesive 31 is heated in the range of about 150° C. to 240° C. or left to stand at room temperature (subjected to room temperature curing). For example, when the first insulating adhesive 31 is a thermoplastic resin, the first insulating adhesive 31 is dried (a solvent therein is volatilized) or heated in the range of about 100° C. to 240° C., and a process of decreasing the temperature is then performed.

Figure 13E:
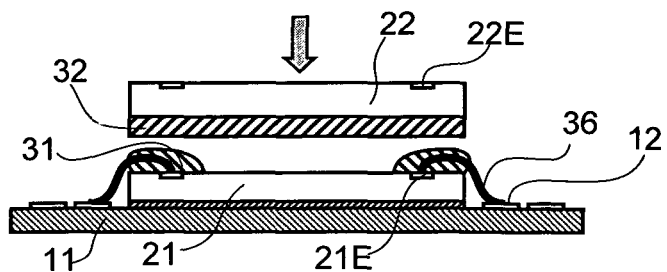

An upper second semiconductor chip 22 is then mounted on the first semiconductor chip 21 (see FIG. 13E). The second semiconductor chip 22 includes electronic circuits and electrode pads 22E on one principal surface (top surface) thereof. A second insulating adhesive 32 is provided on the bottom surface (the surface not having the electronic circuits thereon) of the second semiconductor chip 22. In the state shown in FIG. 13E, the second semiconductor chip 22 is mounted on the first semiconductor chip 21, with the second insulating adhesive 32 therebetween.

The second semiconductor chip 22 is then pressed onto the first semiconductor chip 21 as shown by the arrow while the second semiconductor chip 22 is heated in the range of about 50° C. to 240° C. Thus, the second semiconductor chip 22 is fixed on the first semiconductor chip 21 using the second insulating adhesive 32 (see FIG. 14F). In this step, the first insulating adhesive 31 is disposed on the first semiconductor chip 21 in a cured state or a semi-cured state in a protruding manner.

By heating the second semiconductor chip 22, the viscosity of the second insulating adhesive 32 is decreased, and the fluidity of the second insulating adhesive 32 is increased. Consequently, the second insulating adhesive 32 is applied so as to fill a recess formed by the first insulating adhesive 31 and to cover the first insulating adhesive 31.

Since the first bonding wires 36 are covered with the first insulating adhesive 31, when the second semiconductor chip 22 is mounted on the first semiconductor chip 21, there is no possibility that the first bonding wires 36 are in contact with the bottom surface of the second semiconductor chip 22 or the like. Furthermore, this structure can prevent a phenomenon in which the shapes of the first bonding wires 36 are changed, and contact, short-circuits, or the like between adjacent first bonding wires 36 or breaking of the first bonding wires 36 occurs.

In addition, in this stacked structure, the distance between the first semiconductor chip 21 and the second semiconductor chip 22 is specified by the height of the first insulating adhesive 31 whose height is controlled in advance. Accordingly, the clearance between the first semiconductor chip 21 and the second semiconductor chip 22 can be maintained at a predetermined value. More specifically, the second semiconductor chip 22 is stacked on the first semiconductor chip 21 without becoming tilted, i.e., so as to have a surface parallel to the surface of the first semiconductor chip 21.

The second insulating adhesive 32 may be cured or semi-cured in the step of stacking the second semiconductor chip 22 on the first semiconductor chip 21. Alternatively, after the second semiconductor chip is mounted by being stacked on the first semiconductor chip, the second insulating adhesive 32 may then be cured or semi-cured in the mounted state shown in FIG. 14F.

The process of curing or semi-curing the second insulating adhesive 32 is appropriately selected in accordance with the material of the second insulating adhesive 32. For example, when the second insulating adhesive 32 is a thermosetting resin, the second insulating adhesive 32 is heated in the range of about 150° C. to 240° C. or left to stand at room temperature (subjected to room temperature curing). For example, when the second insulating adhesive 32 is a thermoplastic resin, the second insulating adhesive 32 is dried (a solvent therein is volatilized) or heated in the range of about 100° C. to 240° C., and a process of decreasing the temperature is then performed. In the step of curing or semi-curing the second insulating adhesive 32, the first insulating adhesive 31 in a semi-cured state may be cured at the same time.

Figure 14F:
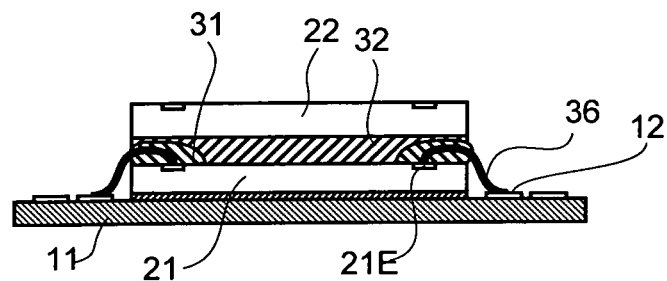
FIGS. 14F, 14G, 14H, and 14I are process cross-sectional views (Part 2) showing the method of producing a stacked-chip semiconductor device according to the ninth embodiment.
Figure 14G:
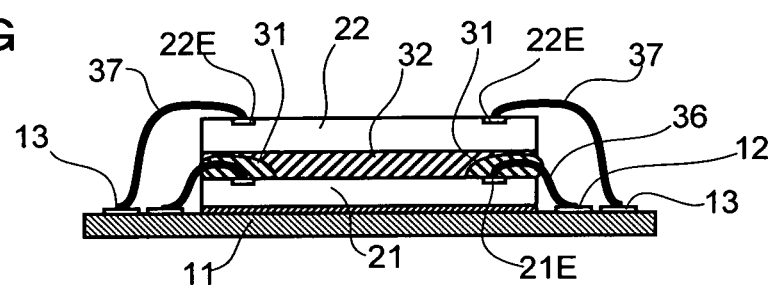

Subsequently, the electrode pads 22E of the second semiconductor chip 22 are connected (wire-bonded) to the electrode pads 13 of the substrate 11 using the second bonding wires 37 (see FIG. 14G). In this step, as described above, the second semiconductor chip 22 is mounted so that the surface of the second semiconductor chip 22 is parallel to the surface of the semiconductor chip 21, and thus the second semiconductor chip 22 is disposed so as to be parallel to the surface of the substrate 11. Accordingly, when the wire bonding is performed, problems such as misalignment and/or bonding failure do not occur.

Figure 14H:
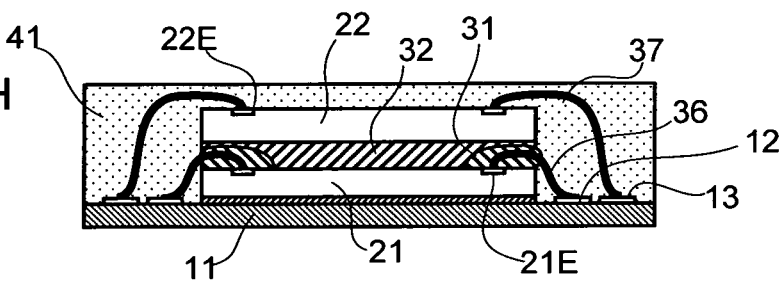

Subsequently, the first semiconductor chip 21, the second semiconductor chip 22, the first bonding wires 36, the second bonding wires 37, and the like are integrally sealed with a sealing resin 41 made of an epoxy resin or the like (see FIG. 14H).

A known transfer mold method or a compression mold method can be employed as the resin sealing method. The sealing is performed by thermally curing the sealing resin. In this step, the first insulating adhesive 31 in a semi-cured state or the second insulating adhesive 32 in a semi-cured state may be cured at the same time.

Figure 14I:
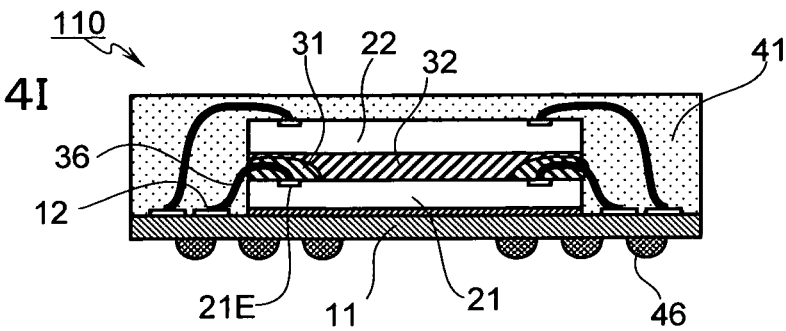

A plurality of solder balls are then formed as external connection terminals 46 on another principal surface (bottom surface) of the substrate 11 (see FIG. 14I). Thus, the stacked-chip semiconductor device 110 shown in FIG. 1 is produced.

In the production method shown in FIG. 13, means shown in FIG. 15 can be used for applying the adhesive 51 on the bottom surface of the semiconductor chip 21, and applying the second insulating adhesive 32 on the bottom surface of the semiconductor chip 22.

Specifically, first, a large adhesive sheet 51S (or an insulating adhesive sheet 32S) is prepared. The adhesive sheet 51S (or the insulating adhesive sheet 32S) has a shape and an area corresponding to a semiconductor wafer 200 in which a plurality of first semiconductor chips 21 (or second semiconductor chips 22) are formed (see FIG. 15A).

Figure 15A:
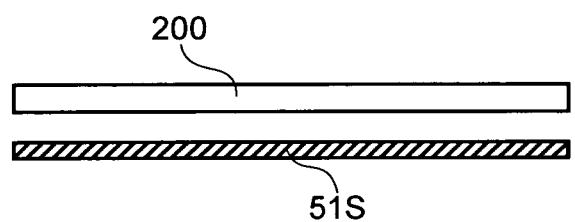
FIGS. 15A, 15B, 15C, and 15D are process cross-sectional views showing an example of a method of applying an insulating adhesive on the bottom surface of a semiconductor chip.
Figure 15B:

The adhesive sheet 51S (or the insulating adhesive sheet 32S) is then applied on the bottom surface (the surface not having electronic circuits thereon) of the semiconductor wafer 200 (see FIG. 15B).

Figure 15C:
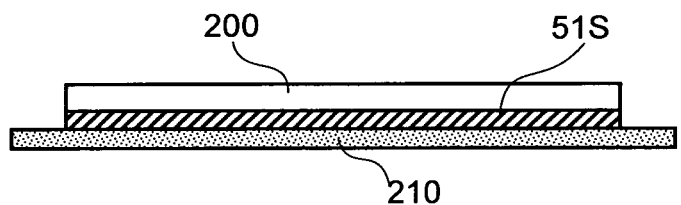
Figure 15D:
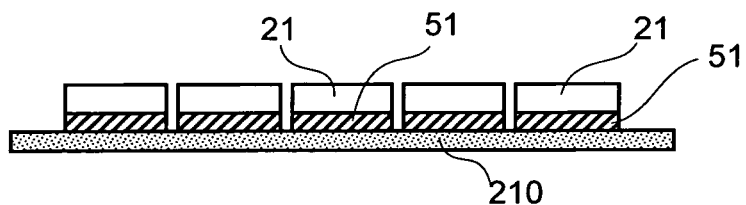

Subsequently, the adhesive sheet 51S (or the insulating adhesive sheet 32S) is applied on a dicing sheet 210 (see FIG. 15C).

A dicing process is performed on the semiconductor wafer 200, and the semiconductor wafer 200 is cut into semiconductor chips. In this step, the adhesive sheet 51S (or the insulating adhesive sheet 32S) is also cut into pieces together with the semiconductor wafer 200 at the same time (see FIG. 15D).

The individual semiconductor chips are then separated from the dicing sheet 210 together with the adhesive sheet 51S (or the insulating adhesive sheet 32S) applied on the bottom surface of the chips.

According to this method, the adhesive (or the insulating adhesive) can be applied with a high efficiency, and in addition, the amount, the thickness, and the like of adhesive applied on the individual semiconductor chips can be uniform, as compared with a method in which an adhesive (or an insulating adhesive) is applied on the bottom surface of semiconductor chips that have been cut into pieces in advance.

10. Tenth Embodiment

A second method of producing a stacked-chip semiconductor device is shown in FIGS. 16A, 16B, 16C, 16D, and 16E, and FIGS. 17F, 17G, 17H, 17I, and 17J as a tenth embodiment.

Figure 16A:
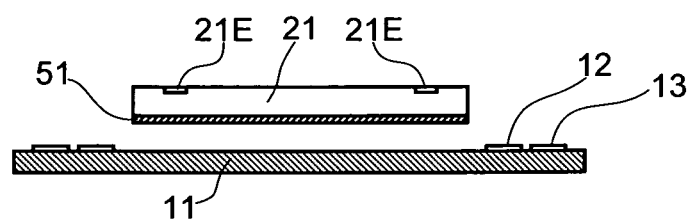
FIGS. 16A, 16B, 16C, 16D, and 16E are process cross-sectional views (Part 1) showing a method of producing a stacked-chip semiconductor device according to a tenth embodiment.

In this embodiment, first, a lower first semiconductor chip 21 is mounted on a substrate 11 used as a chip-mounting component (see FIG. 16A). The first semiconductor chip 21 includes electronic circuits and electrode pads 21E on one principal surface (top surface) thereof. The substrate 11 includes electrode pads 12 and 13 on a surface thereof on which the first semiconductor chip 21 is mounted.

A film adhesive 51 is fixed on the bottom surface of the first semiconductor chip 21 in advance. The first semiconductor chip 21 is bonded and fixed on the substrate 11 by pressing the first semiconductor chip 21 onto the substrate 11 while the substrate 11 is heated.

In this fixing process, instead of heating the substrate 11, the first semiconductor chip 21 may be heated. Alternatively, both the substrate 11 and the first semiconductor chip 21 may be heated.

The heating temperature is in the range of about 50° C. to 100° C. at which the viscosity of the film adhesive 51 is decreased. Alternatively, the first semiconductor chip 21 is mounted on the substrate 11, and the adhesive 51, the substrate 11, and the first semiconductor chip 21 may then be heated in the range of about 120° C. to 240° C. to cure the adhesive 51. Alternatively, instead of using the film adhesive 51, a liquid adhesive may be supplied on the substrate 11 in advance.

In this embodiment, the method shown in FIGS. 15A to 15D can be employed as a method of applying the film adhesive 51 on the bottom surface of the first semiconductor chip 21.

Figure 16B:
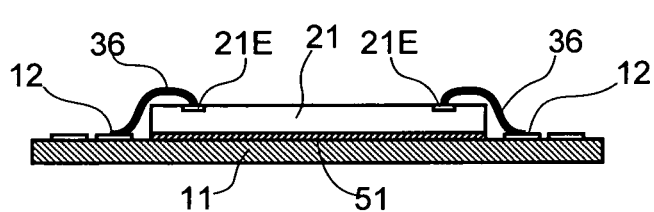

Subsequently, the electrode pads 21E of the first semiconductor chip 21 are connected (wire-bonded) to the electrode pads 12 of the substrate 11 using the first bonding wires 36 (see FIG. 16B).

In this wire bonding, either the normal bonding method in which a first bonding is performed on the electrode pads 21E of the first semiconductor chip 21 and a second bonding is then performed on the electrode pads 12 of the substrate 11, or a "reverse bonding method" in which a first bonding is performed on the electrode pads 12 of the substrate 11 and a second bonding is then performed on the electrode pads 21E of the first semiconductor chip 21 can be employed.

Figure 16C:
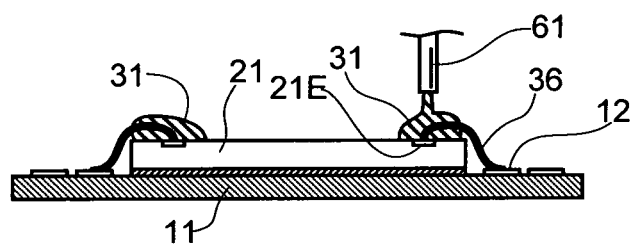

Subsequently, areas near connecting portions including the exposed portions of the electrode pads 21E and the first bonding wires 36 connected to the electrode pads 21E are covered with a first insulating adhesive 31 (see FIG. 16C).

The first insulating adhesive 31 is a liquid resin adhesive and is supplied so as to form any one of the covering arrangements shown in FIGS. 11A, 11B, 11C, and 11D by being discharged from a nozzle 61 in a predetermined liquid amount. When the first insulating adhesive 31 is supplied, in order to prevent changes in the shapes of the first bonding wires 36, the first insulating adhesive 31 may be heated in the range of about 50° C. to 100° C. to increase the fluidity of the first insulating adhesive 31.

In supplying the first insulating adhesive 31, any one of a method of supplying the first insulating adhesive 31 while the substrate 11, the first semiconductor chip 21, and the first bonding wires 36 are heated; a method of supplying the first insulating adhesive 31 while the first insulating adhesive 31 is heated; and a method of supplying the first insulating adhesive 31 while the substrate 11, the first semiconductor chip 21, and the first bonding wires 36 are heated and the first insulating adhesive 31 is also heated can be selected.

In the case where the first insulating adhesive 31 is supplied to a plurality of areas, the amount of first insulating adhesive 31 supplied is controlled so that the heights of the first insulating adhesive 31 in each of the areas are the same when the first insulating adhesive 31 is in a cured state or a semi-cured state.

Figure 16D:
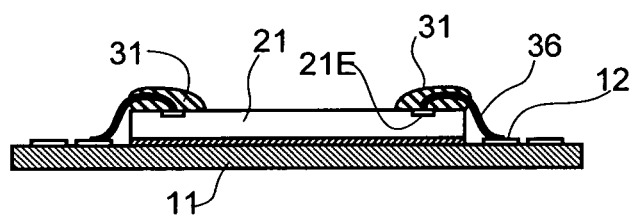

Subsequently, the first insulating adhesive 31 is in a cured state or a semi-cured state (B-stage state), and near areas including the electrode pads 21E and the portions where the electrode pads 21E are connected to the first bonding wires 36 are then fixed (see FIG. 16D).

The process of curing or semi-curing the first insulating adhesive 31 is appropriately selected in accordance with the material of the first insulating adhesive 31. For example, when the first insulating adhesive 31 is a thermosetting resin, the first insulating adhesive 31 is heated in the range of about 150° C. to 240° C. or left to stand at room temperature (subjected to room temperature curing). For example, when the first insulating adhesive 31 is a thermoplastic resin, the first insulating adhesive 31 is dried (a solvent therein is volatilized) or heated in the range of about 100° C. to 240° C., and a process of decreasing the temperature is then performed.

Figure 16E:
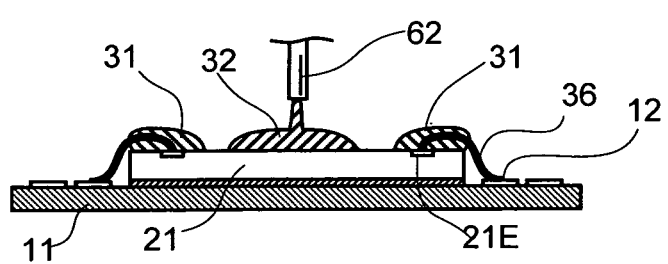

In this embodiment, next, a second insulating adhesive 32 is supplied dropwise on predetermined positions of the first semiconductor chip 21 (see FIG. 16E). This second insulating adhesive 32 is a liquid resin adhesive and is discharged from a nozzle 62 in a predetermined liquid amount. Thus, the second insulating adhesive 32 is supplied on the first semiconductor chip 21. A resin having the same physical properties as those of the first insulating adhesive 31 may be used as the second insulating adhesive 32.

The areas where the second insulating adhesive 32 is supplied on the first semiconductor chip 21 may be the entire top surface of the first semiconductor chip 21 except for the areas where the first insulating adhesive is applied. Any arrangement of the areas where the second insulating adhesive 32 is supplied on the first semiconductor chip 21 can be selected. For example, the second insulating adhesive 32 may be applied on the first semiconductor chip 21 in the form of islands or bands, as shown in FIGS. 12A, 12B, and 12C. The second insulating adhesive is supplied such that the height of the portion where the second insulating adhesive 32 is applied is higher than the height of the portions where the first insulating adhesive 31 is applied.

Figure 17F:
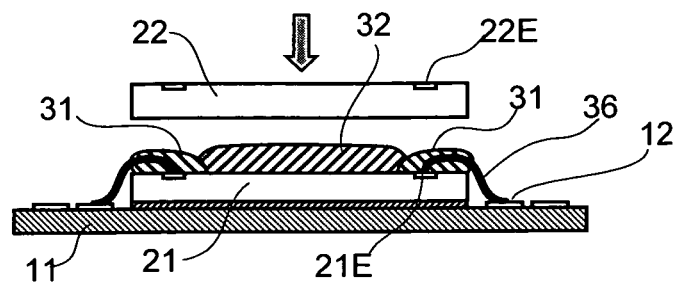
FIGS. 17F, 17G, 17H, 17I, and 17J are process cross-sectional views (Part 2) showing the method of producing a stacked-chip semiconductor device according to the tenth embodiment.

An upper second semiconductor chip 22 is then mounted on the first semiconductor chip 21 (see FIG. 17F). The second semiconductor chip 22 includes electronic circuits and electrode pads 22E on one principal surface (top surface) thereof. The bottom surface (the surface not having the electronic circuits thereon) of the second semiconductor chip 22 faces the first semiconductor chip 21.

By pressing the second semiconductor chip 22 in the direction shown by the arrow in the figure, the second semiconductor chip 22 is brought into contact with the second insulating adhesive 32 and mounted by being stacked on the first semiconductor chip 21. In this case, the first insulating adhesive 31 in a cured state or a semi-cured state is applied on the first semiconductor chip 21 in a protruding manner. In addition, the second insulating adhesive 32 is applied so that the height of the second insulating adhesive 32 is higher than the height of the protruding portions. Accordingly, the second semiconductor chip 22 is mounted in a state in which the second semiconductor chip 22 is in contact with the second insulating adhesive 32.

The first bonding wires 36 are covered with the first insulating adhesive 31. Therefore, when the second semiconductor chip 22 is mounted on the first semiconductor chip 21, the first bonding wires 36 are not in contact with the bottom surface of the second semiconductor chip 22 or the like.

Furthermore, this structure can prevent a phenomenon in which the shapes of the first bonding wires 36 are changed, and contact, short-circuits, or the like between adjacent first bonding wires 36 or breaking of the first bonding wires 36 occurs.

In addition, in this stacked structure, the distance between the first semiconductor chip 21 and the second semiconductor chip 22 is specified by the height of the first insulating adhesive 31 whose height is controlled in advance. Accordingly, the clearance between the first semiconductor chip 21 and the second semiconductor chip 22 can be maintained at a predetermined value. More specifically, the second semiconductor chip 22 is stacked on the first semiconductor chip 21 without becoming tilted, i.e., so as to have a surface parallel to the surface of the first semiconductor chip 21.

The second semiconductor chip 22 is then pressed onto the first semiconductor chip 21 as shown by the arrow while the second semiconductor chip 22 is heated in the range of about 50° C. to 240° C. Thus, the second semiconductor chip 22 is fixed on the first semiconductor chip 21 using the second insulating adhesive 32 (see FIG. 17G). In this step, the second semiconductor chip 22 is fixed on the first semiconductor chip 21 by curing or semi-curing the second insulating adhesive 32 during pressing.

The process of curing or semi-curing the second insulating adhesive 32 is appropriately selected in accordance with the type of second insulating adhesive 32 used. For example, when the second insulating adhesive 32 is a thermosetting resin, the second insulating adhesive 32 is heated in the range of about 150° C. to 240° C. or left to stand at room temperature (subjected to room temperature curing). For example, when the second insulating adhesive 32 is a thermoplastic resin, the second insulating adhesive 32 is dried (a solvent therein is volatilized) or heated in the range of about 100° C. to 240° C., and the temperature is then decreased.

In the process of curing or semi-curing the second insulating adhesive 32, the first insulating adhesive 31 in a semi-cured state may be softened and then cured at the same time. In this case, the first semiconductor chip 21 can be fixed to the second semiconductor chip 22 using the second insulating adhesive 32 and the first insulating adhesive 31. In this case, the first insulating adhesive 31 is disposed on the first semiconductor chip 21 in a cured or a semi-cured state and in a protruding manner.

By heating the second semiconductor chip 22, the viscosity of the second insulating adhesive 32 is decreased, and the fluidity of the second insulating adhesive 32 is increased. Accordingly, the second insulating adhesive 32 is applied so as to fill recesses formed by the first insulating adhesive 31 and cover the first insulating adhesive 31.

Figure 17G:
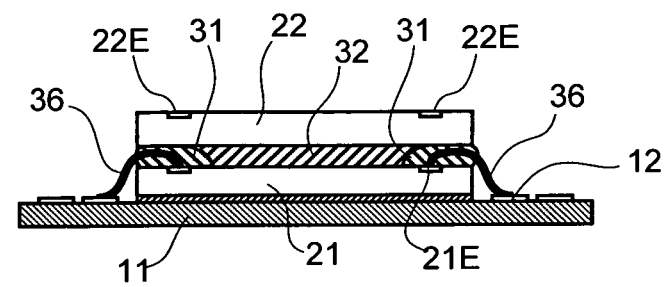

In the steps shown in FIGS. 17F and 17G, the second semiconductor chip 22 may be mounted by being stacked on the first semiconductor chip 21 while the second insulating adhesive 32 is heated.

The heating is performed by heating at least one of the second semiconductor chip 22 and the first semiconductor chip 21 in the range of about 50° C. to 240° C. In such a case, the second insulating adhesive 32 can be cured or semi-cured in a state in which the second semiconductor chip 22 is pressed onto the first semiconductor chip 21. Furthermore, the first insulating adhesive 31 in a semi-cured state may be softened by heating at the same time, and then cured.

The second insulating adhesive 32 may contain a filler made of an insulating material having a dimension at least larger than the diameter of the first bonding wires 36. In such a case, when the first insulating adhesive 31 in a semi-cured state is softened by heating and pressed onto the second semiconductor chip 22, the distance between the first semiconductor chip 21 and the second semiconductor chip 22 can be maintained at a predetermined distance.

Figure 17H:
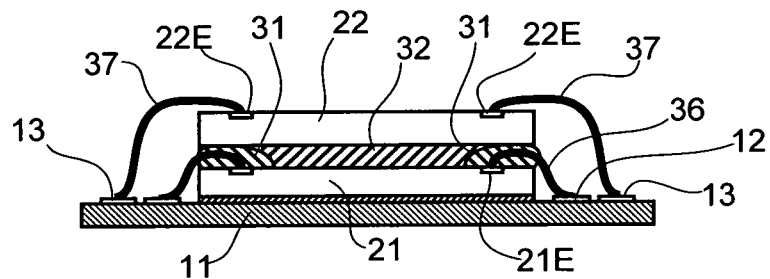

Subsequently, the electrode pads 22E of the second semiconductor chip 22 are connected (wire-bonded) to the electrode pads 13 of the substrate 11 using the second bonding wires 37 (see FIG. 17H). The second semiconductor chip 22 is mounted so that the surface of the second semiconductor chip 22 is parallel to the surface of the substrate 11. Accordingly, when the wire bonding is performed, problems such as misalignment and/or bonding failure do not occur.

Figure 17I:
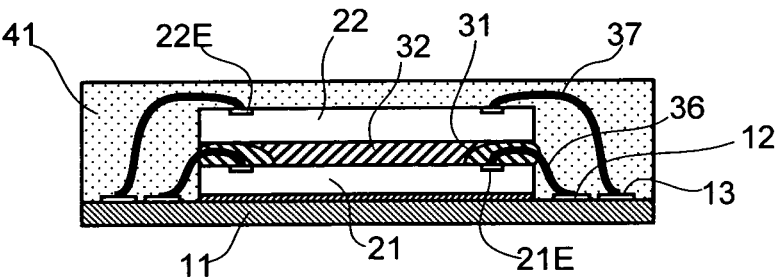

Subsequently, the first semiconductor chip 21, the second semiconductor chip 22, the first bonding wires 36, the second bonding wires 37, and the like are integrally sealed with a sealing resin 41 made of an epoxy resin or the like (see FIG. 17I). A known transfer mold method or a compression mold method can be employed as the resin sealing method.

The sealing is performed by thermally curing the sealing resin. In this step, the first insulating adhesive 31 in a semi-cured state or the second insulating adhesive 32 in a semi-cured state may be cured at the same time.

Figure 17J:
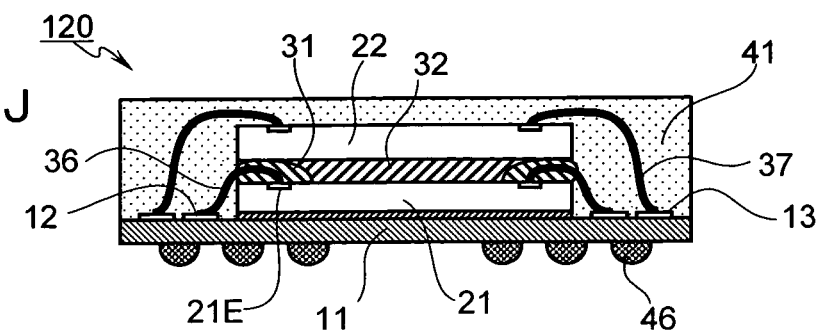

A plurality of solder balls are then formed as external connection terminals 46 on another principal surface (bottom surface) of the substrate 11 (see FIG. 17J). Thus, the stacked-chip semiconductor device 120 shown in FIG. 2 is produced.

11. Eleventh Embodiment

A third method of producing a stacked-chip semiconductor device of is shown in FIGS. 18A, 18B, 18C, 18D, and 18E, and FIGS. 19F, 19G, 19H, and 19I as an eleventh embodiment. In this embodiment, first, a lower first semiconductor chip 21 is mounted on a substrate 11 used as a chip-mounting component (see FIG. 18A).

The first semiconductor chip 21 includes electronic circuits and electrode pads 21E on one principal surface (top surface) thereof. The substrate 11 includes bonding electrode pads 12 and 13 on a surface thereof on which the first semiconductor chip 21 is mounted. A film adhesive 51 is fixed on the bottom surface of the first semiconductor chip 21 in advance. The first semiconductor chip 21 is bonded and fixed on the substrate 11 by pressing the first semiconductor chip 21 onto the substrate 11 while the substrate 11 is heated.

In this fixing process, instead of heating the substrate 11, the first semiconductor chip 21 may be heated. Alternatively, both the substrate 11 and the first semiconductor chip 21 may be heated.

The heating temperature is in the range of about 50° C. to 100° C. at which the viscosity of the film adhesive 51 is decreased. Alternatively, the first semiconductor chip 21 is mounted on the substrate 11, and the adhesive 51, the substrate 11, and the first semiconductor chip 21 may then be heated in the range of about 120° C. to 240° C. to cure the adhesive 51. Alternatively, instead of using the film adhesive 51, a liquid adhesive may be supplied on the substrate 11 in advance.

The first semiconductor chip 21 on which the film adhesive 51 is fixed can be obtained by the method shown by FIGS. 15A to 15D.

Figure 18A:
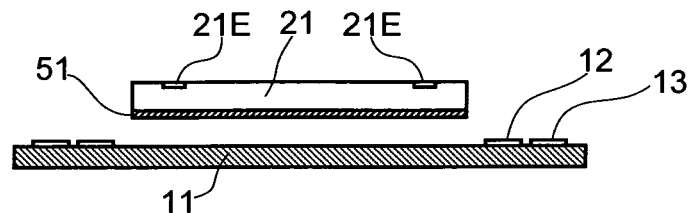
FIGS. 18A, 18B, 18C, 18D, and 18E are process cross-sectional views (Part 1) showing a method of producing a stacked-chip semiconductor device according to an eleventh embodiment.
Figure 18B:
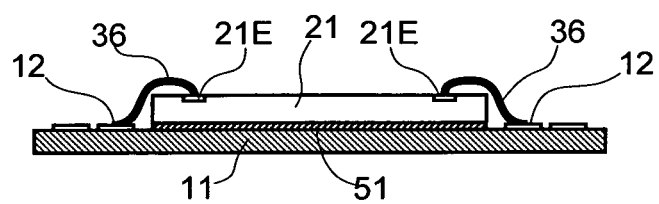

Subsequently, the electrode pads 21E of the first semiconductor chip 21 are connected (wire-bonded) to the electrode pads 12 of the substrate 11 using the first bonding wires 36 (see FIG. 18B).

In this wire bonding, either the normal bonding method in which a first bonding is performed on the electrode pads 21E of the first semiconductor chip 21 and a second bonding is then performed on the electrode pads 12 of the substrate 11, or a "reverse bonding method" in which a first bonding is performed on the electrode pads 12 of the substrate 11 and a second bonding is then performed on the electrode pads 21E of the first semiconductor chip 21 can be employed.

Figure 18C:
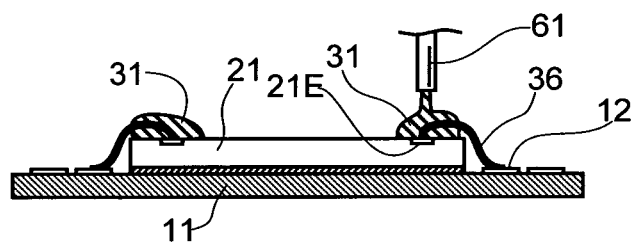

Subsequently, areas near connecting portions including the exposed portions of the electrode pads 21E and the first bonding wires 36 connected to the electrode pads 21E are covered with a first insulating adhesive 31 (see FIG. 18C). The first insulating adhesive 31 is a liquid resin adhesive and is supplied so as to form any one of the covering arrangements shown in FIGS. 11A, 11B, 11C, and 11D by being discharged from a nozzle 61 in a predetermined liquid amount.

When the first insulating adhesive 31 is supplied, in order to prevent changes in the shapes of the first bonding wires 36, the first insulating adhesive 31 may be heated in the range of about 50° C. to 100° C. to increase the fluidity of the first insulating adhesive 31. In supplying the first insulating adhesive 31, any one of a method of supplying the first insulating adhesive 31 while the substrate 11, the first semiconductor chip 21, and the first bonding wires 36 are heated; a method of supplying the first insulating adhesive 31 while the first insulating adhesive 31 is heated; and a method of supplying the first insulating adhesive 31 while the substrate 11, the first semiconductor chip 21, and the first bonding wires 36 are heated and the first insulating adhesive 31 is also heated can be selected.

In the case where the first insulating adhesive 31 is supplied to a plurality of areas, the amount of first insulating adhesive 31 supplied is controlled so that the heights of the first insulating adhesive 31 in each of the areas are the same when the first insulating adhesive 31 is in a cured state or a semi-cured state.

Figure 18D:
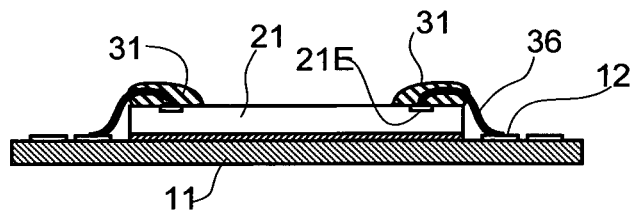

Subsequently, the first insulating adhesive 31 is in a semi-cured state (B-stage state), and near areas including the electrode pads 21E and the portions where the electrode pads 21E are connected to the first bonding wires 36 are then fixed (see FIG. 18D).

The process of semi-curing the first insulating adhesive 31 is appropriately selected in accordance with the material of the first insulating adhesive 31. For example, when the first insulating adhesive 31 is a thermosetting resin, the first insulating adhesive 31 is heated in the range of about 150° C. to 240° C. or left to stand at room temperature (subjected to room temperature curing). For example, when the first insulating adhesive 31 is a thermoplastic resin, the first insulating adhesive 31 is dried (a solvent therein is volatilized) or heated in the range of about 100° C. to 240° C., and a process of decreasing the temperature is then performed.

Figure 18E:
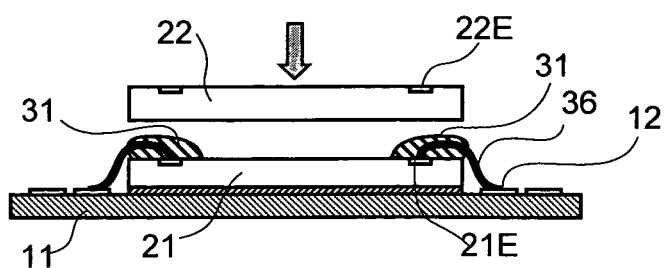

An upper second semiconductor chip 22 is then mounted by being stacked on the first semiconductor chip 21 (see FIG. 18E). Circuits and second electrode pads 22E are provided on the top surface of the second semiconductor chip 22. The bottom surface of the second semiconductor chip 22 faces the first semiconductor chip 21.

The second semiconductor chip 22 is brought into contact with the first insulating adhesive 31 by moving the second semiconductor chip 22 toward the first semiconductor chip 21 while heating in the range of about 5° C. to 200° C. in the direction shown by the arrow. Thus, the second semiconductor chip 22 is mounted by being stacked on the first semiconductor chip 21. In this case, the first insulating adhesive 31 in a semi-cured state is fixed on the first semiconductor chip 21 in a protruding manner.

By heating the second semiconductor chip 22, the viscosity of the first insulating adhesive 31 in a semi-cured state is decreased in near portions where the first insulating adhesive 31 is in contact with the second semiconductor chip 22. Thus, the first insulating adhesive 31 holds the second semiconductor chip 22 by bonding.

Subsequently, the first insulating adhesive 31 is cured or semi-cured by heating in a state in which the second semiconductor chip 22 is stacked on the first semiconductor chip 21. Thus, the second semiconductor chip 22 is fixed to the first semiconductor chip 21 using the first insulating adhesive 31 (see FIG. 19F).

The process of curing or semi-curing the first insulating adhesive 31 is appropriately selected in accordance with the type of first insulating adhesive used. For example, when the first insulating adhesive 31 is a thermosetting resin, the first insulating adhesive 31 is heated in the range of about 150° C. to 240° C. or left to stand at room temperature (subjected to room temperature curing). For example, when the first insulating adhesive 31 is a thermoplastic resin, the first insulating adhesive 31 is dried (a solvent therein is volatilized) or heated in the range of about 100° C. to 240° C., and the temperature is then decreased. The strength of bonding between the second semiconductor chip 22 and the first semiconductor chip 21 can be increased by performing this process. However, this process may be omitted depending on the bonding state when the second semiconductor chip is mounted by being stacked on the first semiconductor chip.

The first bonding wires 36 are covered with the first insulating adhesive 31, and the viscosity of the first insulating adhesive 31 is decreased only in near areas where the first insulating adhesive 31 is in contact with the second semiconductor chip 22. Therefore, when the second semiconductor chip 22 is mounted on the first semiconductor chip 21, there is no possibility that the first bonding wires 36 are in contact with the bottom surface of the second semiconductor chip 22 or the like. Furthermore, this structure can prevent a phenomenon in which the shapes of the first bonding wires 36 are changed, and contact, short-circuits, or the like between adjacent first bonding wires 36 or breaking of the first bonding wires 36 occurs.

In addition, in this stacked structure, the distance between the first semiconductor chip 21 and the second semiconductor chip 22 is specified by the height of the first insulating adhesive 31 whose height is controlled in advance. Accordingly, the clearance between the first semiconductor chip 21 and the second semiconductor chip 22 can be maintained at a predetermined value. More specifically, the second semiconductor chip 22 is stacked on the first semiconductor chip 21 without becoming tilted, i.e., so as to have a surface parallel to the surface of the first semiconductor chip 21.

Figure 19F:
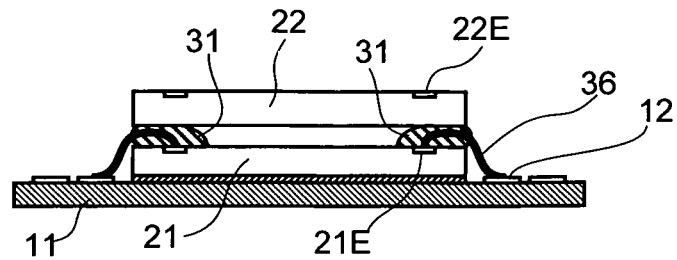
FIGS. 19F, 19G, 19H, and 19I are process cross-sectional views (Part 2) showing the method of producing a stacked-chip semiconductor device according to the eleventh embodiment.
Figure 19G:
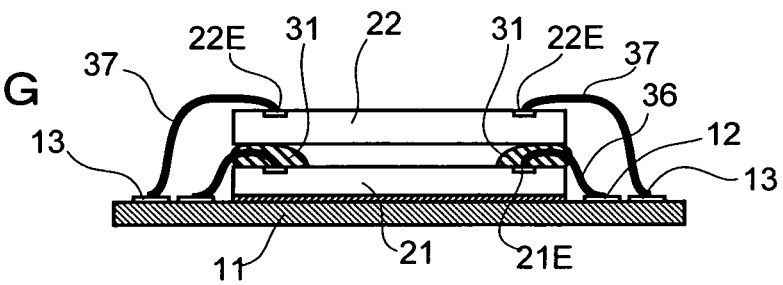

Subsequently, the electrode pads 22E of the second semiconductor chip 22 are connected (wire-bonded) to the electrode pads 13 of the substrate 11 using the second bonding wires 37 (see FIG. 19G). The second semiconductor chip 22 is mounted so that the surface of the second semiconductor chip 22 is parallel to the surface of the substrate 11. Accordingly, when the wire bonding is performed, problems such as misalignment and/or bonding failure do not occur.

Figure 19H:
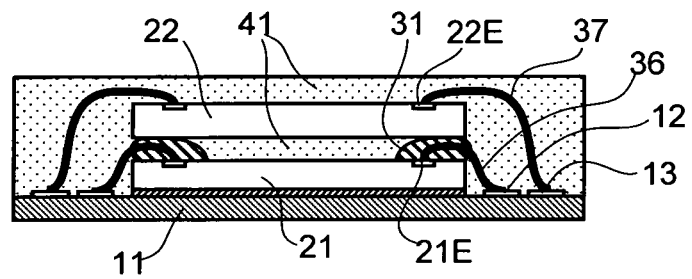

Subsequently, the first semiconductor chip 21, the second semiconductor chip 22, the first bonding wires 36, the second bonding wires 37, and the like are integrally sealed with a sealing resin 41 made of an epoxy resin or the like (see FIG. 19H). A known transfer mold method or a compression mold method can be employed as the resin sealing method. The sealing is performed by thermally curing the sealing resin. In this step, the first insulating adhesive 31 in a semi-cured state may be cured at the same time.

Figure 19I:
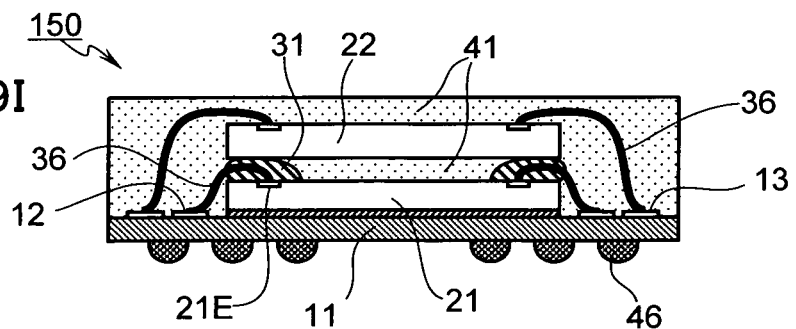

A plurality of solder balls are then formed as external connection terminals 46 on another principal surface (bottom surface) of the substrate 11 (see FIG. 19I). Thus, the stacked-chip semiconductor device 150 shown in FIG. 6 is produced.

12. Twelfth Embodiment

A fourth method of producing a stacked-chip semiconductor device of is shown in FIGS. 20A, 20B, 20C, 20D, and 20E, and FIGS. 21F, 21G, 21H, 21I, and 21J as a twelfth embodiment. In this embodiment, a lead frame 70 is used as a chip-mounting component.

Figure 20A:
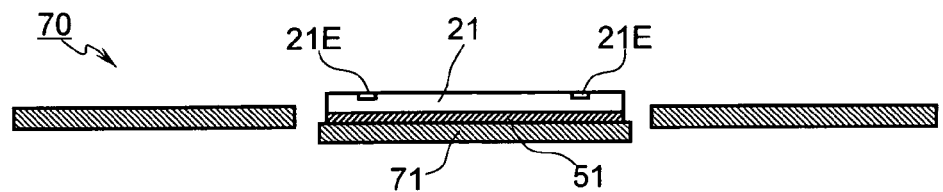
FIGS. 20A, 20B, 20C, 20D, and 20E are process cross-sectional views (Part 1) showing a method of producing a stacked-chip semiconductor device according to a twelfth embodiment.

In this embodiment, first, a lower first semiconductor chip 21 is mounted on a die stage 71 of the lead frame 70 (see FIG. 20A).

The first semiconductor chip 21 includes electronic circuits and electrode pads 21E on one principal surface (top surface) thereof. The lead frame 70 includes the die stage 71 functioning as a mounting portion of the first semiconductor chip 21. The lead frame 70 also includes a plurality of inner lead portions 72 connected to the electrode pads 21E of the first semiconductor chip 21 via bonding wires 36, and outer lead portions 73 disposed at extending portions of the inner lead portions 72.

A film adhesive 51 is fixed on the bottom surface of the first semiconductor chip 21 in advance. The first semiconductor chip 21 is bonded and fixed on the die stage 71 by pressing the first semiconductor chip 21 onto the die stage 71 while the lead frame 70 is heated. In this fixing process, instead of heating the lead frame 70, the first semiconductor chip 21 may be heated. Alternatively, both the lead frame 70 and the first semiconductor chip 21 may be heated.

The heating temperature is in the range of about 50° C. to 100° C. at which the viscosity of the film adhesive 51 is decreased. Alternatively, the semiconductor chip 21 is mounted on the die stage 71, and the adhesive 51, the substrate 11, and the semiconductor chip 21 may then be heated in the range of about 120° C. to 240° C. to cure the adhesive 51. Alternatively, instead of using the film adhesive 51, a liquid adhesive may be supplied on the die stage 71.

Figure 20B:
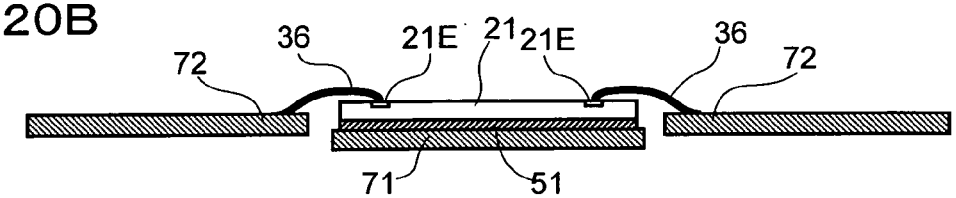

Subsequently, the electrode pads 21E of the first semiconductor chip 21 are connected (wire-bonded) to the inner lead portions 72 of the lead frame 70 using the first bonding wires 36 (see FIG. 20B). In this wire bonding, either the normal bonding method in which a first bonding is performed on the electrode pads 21E of the first semiconductor chip 21 and a second bonding is then performed on the inner lead portions 72 of the lead frame 70, or a "reverse bonding method" in which a first bonding is performed on the inner lead portions 72 of the lead frame 70 and a second bonding is then performed on the electrode pads 21E of the first semiconductor chip 21 can be employed.

Figure 20C:
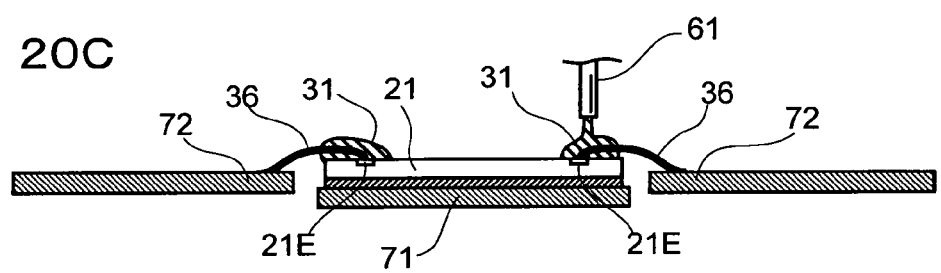

Subsequently, areas near connecting portions including the exposed portions of the electrode pads 21E and the first bonding wires 36 connected to the electrode pads 21E are covered with a first insulating adhesive 31 (see FIG. 20C). The first insulating adhesive 31 is a liquid resin adhesive and is supplied so as to form any one of the covering arrangements shown in FIGS. 11A, 11B, 11C, and 11D by being discharged from a nozzle 61 in a predetermined liquid amount. When the first insulating adhesive 31 is supplied, in order to prevent changes in the shapes of the first bonding wires 36, the first insulating adhesive 31 may be heated in the range of about 50° C. to 100° C. to increase the fluidity of the first insulating adhesive 31.

In supplying the first insulating adhesive 31, any one of a method of supplying the first insulating adhesive 31 while the lead frame 70, the first semiconductor chip 21, and the first bonding wires 36 are heated; a method of supplying the first insulating adhesive 31 while the first insulating adhesive 31 is heated; and a method of supplying the first insulating adhesive 31 while the lead frame 70, the first semiconductor chip 21, and the first bonding wires 36 are heated and the first insulating adhesive 31 is also heated can be selected.

In the case where the first insulating adhesive 31 is supplied to a plurality of areas, the amount of first insulating adhesive 31 supplied is controlled so that the heights of the first insulating adhesive 31 in each of the areas are the same when the first insulating adhesive 31 is in a cured state or a semi-cured state.

Figure 20D:
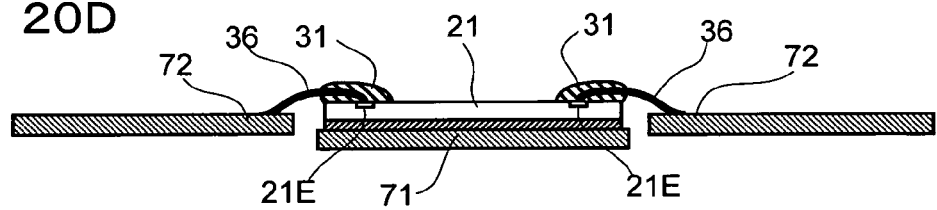

Subsequently, the first insulating adhesive 31 is in a cured state or a semi-cured state (B-stage state), and near areas including the electrode pads 21E and the portions where the electrode pads 21E are connected to the first bonding wires 36 are then fixed (see FIG. 20D). The process of curing or semi-curing the first insulating adhesive 31 is appropriately selected in accordance with the material of the first insulating adhesive 31. For example, when the first insulating adhesive 31 is a thermosetting resin, the first insulating adhesive 31 is heated in the range of about 150° C. to 240° C. or left to stand at room temperature (subjected to room temperature curing). For example, when the first insulating adhesive 31 is a thermoplastic resin, the first insulating adhesive 31 is dried (a solvent therein is volatilized) or heated in the range of about 100° C. to 240° C., and a process of decreasing the temperature is then performed.

Figure 20E:
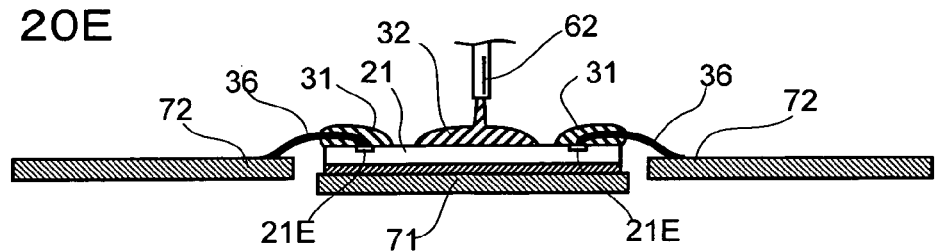

Next, a second insulating adhesive 32 is supplied dropwise on predetermined positions of the first semiconductor chip 21 (see FIG. 20E). The second insulating adhesive 32 is a liquid resin adhesive and is discharged from a nozzle 62 in a predetermined liquid amount. Thus, the second insulating adhesive 32 is supplied on the first semiconductor chip 21. A resin having the same physical properties as those of the first insulating adhesive 31 may be used as the second insulating adhesive 32.

The areas where the second insulating adhesive 32 is supplied on the first semiconductor chip 21 may be the entire top surface of the first semiconductor chip 21 except for the areas where the first insulating adhesive 31 is applied. Any arrangement of the areas where the second insulating adhesive 32 is supplied on the first semiconductor chip 21 can be selected. For example, the second insulating adhesive 32 may be applied on the first semiconductor chip 21 in the form of island or bands, as shown in FIGS. 12A, 12B, and 12C. The second insulating adhesive 32 is supplied such that the height (thickness) of the second insulating adhesive 32 is higher than the height (thickness) of the first insulating adhesive 31.

An upper second semiconductor chip 22 is then mounted on the first semiconductor chip 21 (see FIG. 21F). The second semiconductor chip 22 includes electronic circuits and electrode pads 22E on one principal surface (top surface) thereof. The bottom surface (the surface not having the electronic circuits thereon) of the second semiconductor chip 22 faces the first semiconductor chip 21. By pressing the second semiconductor chip 22 in the direction shown by the arrow in the figure, the second semiconductor chip 22 is brought into contact with the second insulating adhesive 32 and mounted by being stacked on the first semiconductor chip 21.

In this case, the first insulating adhesive 31 in a cured state or a semi-cured state is applied on the first semiconductor chip 21 in a protruding manner. In addition, the second insulating adhesive 32 is applied so that the height of the second insulating adhesive 32 is higher than the height of the protruding portions. Accordingly, the second semiconductor chip 22 is mounted in a state in which the second semiconductor chip 22 is in contact with the second insulating adhesive 32.

The first bonding wires 36 are covered with the first insulating adhesive 31. Therefore, when the second semiconductor chip 22 is mounted on the first semiconductor chip 21, there is no possibility that the first bonding wires 36 are in contact with the bottom surface of the second semiconductor chip 22 or the like. Furthermore, this structure can prevent a phenomenon in which the shapes of the first bonding wires 36 are changed, and contact, short-circuits, or the like between adjacent first bonding wires 36 or breaking of the first bonding wires 36 occurs.

In addition, in this stacked structure, the distance between the first semiconductor chip 21 and the second semiconductor chip 22 is specified by the height of the first insulating adhesive 31 whose height is controlled in advance. Accordingly, the clearance between the first semiconductor chip 21 and the second semiconductor chip 22 can be maintained at a predetermined value. More specifically, the second semiconductor chip 22 is stacked on the first semiconductor chip 21 without becoming tilted, i.e., so as to have a surface parallel to the surface of the first semiconductor chip 21.

The second semiconductor chip 22 is then pressed onto the first semiconductor chip 21 as shown by the arrow while the second semiconductor chip 22 is heated in the range of about 50° C. to 240° C. Thus, the second semiconductor chip 22 is fixed on the first semiconductor chip 21 using the second insulating adhesive 32 (see FIG. 21G). In this step, the second semiconductor chip 22 is fixed to the first semiconductor chip 21 by curing or semi-curing the second insulating adhesive 32 during pressing.

The process of curing or semi-curing the second insulating adhesive 32 is appropriately selected in accordance with the type of second insulating adhesive 32 used. For example, when the second insulating adhesive 32 is a thermosetting resin, the second insulating adhesive 32 is heated in the range of about 150° C. to 240° C. or left to stand at room temperature (subjected to room temperature curing). For example, when the second insulating adhesive 32 is a thermoplastic resin, the second insulating adhesive 32 is dried (a solvent therein is volatilized) or heated in the range of about 100° C. to 240° C., and the temperature is then decreased.

In the process of curing or semi-curing the second insulating adhesive 32, the first insulating adhesive 31 in a semi-cured state may be softened and then cured at the same time. In this case, the first semiconductor chip 21 can be fixed to the second semiconductor chip 22 using the second insulating adhesive 32 and the first insulating adhesive 31. In this case, the first insulating adhesive 31 is disposed on the first semiconductor chip 21 in a cured or a semi-cured state and in a protruding manner. Accordingly, by heating the second semiconductor chip 22, the viscosity of the second insulating adhesive 32 is decreased, and the fluidity of the second insulating adhesive 32 is increased. Consequently, the second insulating adhesive 32 is applied so as to fill recesses formed by the first insulating adhesive 31 and cover the first insulating adhesive 31.

In this case, the first insulating adhesive 31 in a cured or semi-cured state is fixed on the first semiconductor chip 21 in a protruding manner. In addition, and the second insulating adhesive 32 is applied so that the height of the second insulating adhesive 32 is higher than the height of the protruding portions. Accordingly, the second semiconductor chip 22 is in contact with the second insulating adhesive 32 applied on the first semiconductor chip 21.

The distance between the first semiconductor chip 21 and the second semiconductor chip 22 is specified by the height of the first insulating adhesive 31 whose height is controlled in advance. Accordingly, the clearance between the first semiconductor chip 21 and the second semiconductor chip 22 can be maintained at a predetermined value. More specifically, the second semiconductor chip 22 is stacked on the first semiconductor chip 21 without becoming tilted.

In FIG. 21G, instead of using the method described above, the second semiconductor chip 22 may be mounted by being stacked on the first semiconductor chip 21 under pressure while the second insulating adhesive 32 is heated. The heating is performed by heating at least one of the second semiconductor chip 22 and the first semiconductor chip 21, for example, in the range of about 50° C. to 240° C. In such a case, the second insulating adhesive 32 can be cured or semi-cured in a state in which the second semiconductor chip 22 is pressed onto the first semiconductor chip 21. Furthermore, in this step, the first insulating adhesive 31 in a semi-cured state may be softened by heating at the same time, and then cured.

The second insulating adhesive 32 may contain a filler made of an insulating material having a dimension at least larger than the diameter of the first bonding wires 36. In such a case, when the first insulating adhesive 31 in a semi-cured state is softened by heating and pressed onto the second semiconductor chip 22, the distance between the first semiconductor chip 21 and the second semiconductor chip 22 can be maintained at a predetermined distance.

Subsequently, the electrode pads 22E of the second semiconductor chip 22 are connected (wire-bonded) to the inner lead portions 72 of the lead frame 70 using the second bonding wires 37 (see FIG. 21H). The second semiconductor chip 22 is mounted so that the surface of the second semiconductor chip 22 is parallel to the surface of the die stage 71 of the lead frame 70. Accordingly, when the wire bonding is performed, problems such as misalignment and/or bonding failure do not occur.

Subsequently, the first semiconductor chip 21, the second semiconductor chip 22, the first bonding wires 36, the second bonding wires 37, and the like are integrally sealed with a sealing resin 41 made of an epoxy resin or the like (see FIG. 21I).

A known transfer mold method or a compression mold method can be employed as the resin sealing method. The sealing is performed by thermally curing the sealing resin. In this step, the first insulating adhesive 31 in a semi-cured state or the second insulating adhesive 32 in a semi-cured state may be cured at the same time.

The lead frame 70 is then separated by cutting, and the shapes of the lead portions are arranged, thus forming a separated semiconductor device (see FIG. 21J). Thus, the stacked-chip semiconductor device 170 shown in FIG. 8 is produced.

In the embodiment shown in FIG. 21J and other figures, a bonding wire 36 and a bonding wire 37 are connected to a single inner lead 72, but the structure is not limited thereto. Alternatively, each of the bonding wire 36 and the bonding wire 37 may be connected to different inner leads 72 (not shown).

The structure of the stacked-chip semiconductor device is not limited to the structures described in the above embodiments. Various modifications can be made as long as wire-bonded portions of a first semiconductor chip mounted on a chip-mounting component are covered with an insulating adhesive to suppress breaking of bonding wires, short-circuits of bonding wires, and the like due to a mechanical stress generated in a step of stacking a second semiconductor chip.

Industrial Applicability

The embodiments relate to a semiconductor device and a method of producing the same. More specifically, the embodiments can be applied to a stacked-chip semiconductor device having a structure in which a second semiconductor chip is disposed on a first semiconductor chip and on bonding wires connected to electrode pads of the first semiconductor chip, and a method of producing the same.

What is claimed is:

1. A semiconductor device comprising:
a chip-mounting component;
a first semiconductor chip provided on the chip-mounting component;
bonding wires connected to electrode pads of the first semiconductor chip;
a first insulating adhesive that selectively covers connecting portions where the electrode pads are connected to the bonding wires;
a second insulating adhesive provided on the first insulating adhesive and on a top surface of the first semiconductor chip that is not covered with the first insulating adhesive; and
a second semiconductor chip provided over the first semiconductor chip and the first insulating adhesive, wherein:
the second insulating adhesive is filled between the first semiconductor chip and the second semiconductor chip, and between the first insulating adhesive and the second semiconductor chip, and
the second semiconductor chip and the first insulating adhesive are isolated by the second insulating adhesive.

2. The semiconductor device according to claim 1, wherein the first semiconductor chip, the second semiconductor chip, the bonding wires, and the first insulating adhesive are sealed with a resin on the chip-mounting component; and
the resin is provided in an area between the first semiconductor chip and the second semiconductor chip, the area not covered with the first insulating adhesive.

3. The semiconductor device according to claim 1, wherein the first insulating adhesive individually covers a plurality of connecting portions where the electrode pads are connected to the bonding wires.

4. The semiconductor device according to claim 1, wherein the first insulating adhesive integrally covers a plurality of connecting portions where the electrode pads are connected to the bonding wires.

5. The semiconductor device according to claim 1, wherein the entirety of the bonding wires are covered with the first insulating adhesive.

6. The semiconductor device according to claim 1, wherein the chip-mounting component is a die stage of a lead frame, and another end of each of the bonding wires is connected to an inner lead of the lead frame.

7. The semiconductor device according to claim 1, wherein the bonding wires are connected to the electrode pads via bumps.

8. The semiconductor device according to claim 1, further comprising:
- a second insulating adhesive provided on the top surface of the first semiconductor chip that is not covered with the first insulating adhesive,
  - wherein the second semiconductor chip is provided on the first semiconductor chip, with the first insulating adhesive and the second insulating adhesive therebetween.

9. The semiconductor device according to claim 8, wherein the second insulating adhesive is locally provided on the top surface of the first semiconductor chip in the form of islands.

10. The semiconductor device according to claim 8, wherein the second insulating adhesive comprises a filler composed of particles made of an insulating material.

11. The semiconductor device according to claim 10, wherein the maximum diameter of the filler is larger than the diameter of the bonding wires.

12. The semiconductor device according to claim 11, wherein the maximum diameter of the filler is larger than the diameter of the bonding wires and larger than the thickness of the first insulating adhesive layer.

* * * * *